US009655281B2

(12) United States Patent
Harvilchuck et al.

(10) Patent No.: US 9,655,281 B2
(45) Date of Patent: May 16, 2017

(54) MODULAR COOLING SYSTEM

(71) Applicant: Seagate Technology LLC, Cupertino, CA (US)

(72) Inventors: Laurence A. Harvilchuck, Brackney, PA (US); Alex Carl Worrall, Waterlooville (GB)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/751,488

(22) Filed: Jun. 26, 2015

(65) Prior Publication Data

US 2016/0381834 A1    Dec. 29, 2016

(51) Int. Cl.
*H05K 7/20* (2006.01)
*F28F 9/02* (2006.01)
*F16L 37/14* (2006.01)

(52) U.S. Cl.
CPC ........ *H05K 7/20636* (2013.01); *F16L 37/146* (2013.01); *F28F 9/02* (2013.01); *H05K 7/20781* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | |
|---|---|---|
| 5,370,178 A | 12/1994 | Agonafer et al. |
| 6,069,791 A | 5/2000 | Goto et al. |
| 6,580,609 B2 | 6/2003 | Pautsch |
| 6,807,056 B2 | 10/2004 | Kondo et al. |
| 6,889,515 B2 | 5/2005 | Tilton et al. |
| 6,989,990 B2 | 1/2006 | Malone et al. |
| 7,236,363 B2 | 6/2007 | Belady |
| 7,295,436 B2 | 11/2007 | Cheon |
| 7,318,322 B2 | 1/2008 | Ota |
| 7,355,852 B2 | 4/2008 | Pfahnl |
| 7,450,385 B1 | 11/2008 | Campbell et al. |
| 7,564,685 B2 | 7/2009 | Clidaras et al. |
| 7,724,524 B1 | 5/2010 | Campbell et al. |
| 7,905,106 B2 | 3/2011 | Attlesey |
| 8,035,972 B2 | 10/2011 | Ostwald et al. |
| 8,089,766 B2 | 1/2012 | Attlesey |
| 8,351,200 B2 | 1/2013 | Arimilli et al. |
| 8,854,808 B2 | 10/2014 | Mullady |

(Continued)

*Primary Examiner* — Anthony Haughton
*Assistant Examiner* — Razmeen Gafur
(74) *Attorney, Agent, or Firm* — Taylor English Duma LLP

(57) ABSTRACT

Technologies for modular cooling systems for cooling electronic components installed in equipment racks are provided herein. A modular cooling system comprises a cold plate and a support manifold connected to the cold plate. Together, the support manifold and cold plate define a fluid path for cooling fluid from the support manifold to the cold plate. The modular cooling system also includes an equipment carrier including equipment cooled by the cold plate.

11 Claims, 16 Drawing Sheets

(56) References Cited

U.S. PATENT DOCUMENTS

| | | | |
|---|---|---|---|
| 2005/0024831 A1* | 2/2005 | Phillips | F28D 15/025 361/700 |
| 2005/0180104 A1* | 8/2005 | Olesen | F28F 3/12 361/699 |
| 2005/0243517 A1 | 11/2005 | Malone et al. | |
| 2005/0259397 A1* | 11/2005 | Bash | G06F 1/20 361/699 |
| 2006/0002086 A1* | 1/2006 | Teneketges | H01L 23/473 361/699 |
| 2006/0007720 A1* | 1/2006 | Pfeifer | H05K 7/20927 363/141 |
| 2007/0076376 A1* | 4/2007 | Mongia | G06F 1/20 361/700 |
| 2007/0159797 A1* | 7/2007 | Teneketges | H01L 23/473 361/699 |
| 2007/0163750 A1* | 7/2007 | Bhatti | F28F 9/026 165/80.4 |
| 2007/0188991 A1* | 8/2007 | Wilson | H01L 23/473 361/699 |
| 2008/0068792 A1* | 3/2008 | Chang | H01L 23/473 361/679.5 |
| 2008/0093054 A1 | 4/2008 | Tilton et al. | |
| 2008/0212282 A1* | 9/2008 | Hall | G06F 1/20 361/701 |
| 2008/0259566 A1* | 10/2008 | Fried | F28D 15/0266 361/699 |
| 2009/0161312 A1* | 6/2009 | Spearing | H05K 7/20727 361/679.47 |
| 2010/0002393 A1* | 1/2010 | Campbell | H05K 7/20772 361/699 |
| 2010/0290188 A1* | 11/2010 | Brunschwiler | H01L 23/473 361/699 |
| 2011/0063792 A1* | 3/2011 | Schmidt | G06F 1/20 361/679.46 |
| 2011/0313576 A1* | 12/2011 | Nicewonger | F28D 15/00 700/282 |
| 2012/0120605 A1* | 5/2012 | Arvelo | H05K 7/20772 361/702 |
| 2012/0147553 A1* | 6/2012 | Eriksen | H05K 7/20781 361/679.53 |
| 2012/0212907 A1* | 8/2012 | Dede | H01L 23/4735 361/702 |
| 2012/0327602 A1* | 12/2012 | Kulkarni | H02M 7/003 361/700 |
| 2013/0105116 A1 | 5/2013 | Campbell et al. | |
| 2013/0107457 A1 | 5/2013 | Campbell et al. | |
| 2013/0271918 A1* | 10/2013 | Neville Hughes | H05K 7/20309 361/702 |
| 2013/0343005 A1* | 12/2013 | David | H05K 13/00 361/721 |
| 2014/0071616 A1* | 3/2014 | Watanabe | H05K 7/20736 361/679.47 |
| 2014/0233175 A1* | 8/2014 | Demange | H05K 7/20772 361/679.47 |

\* cited by examiner

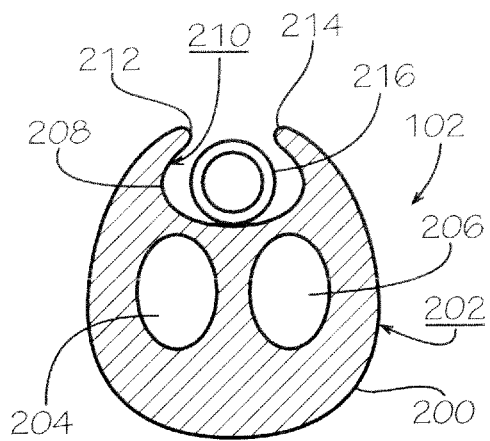
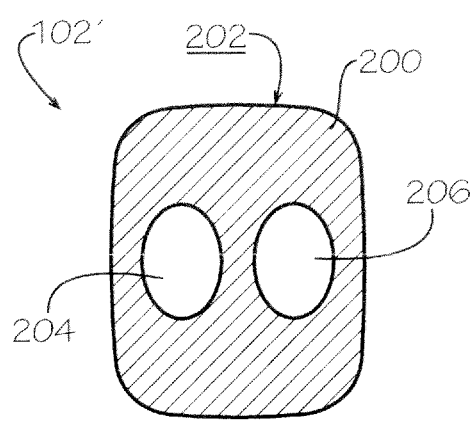
FIG. 2  FIG. 3
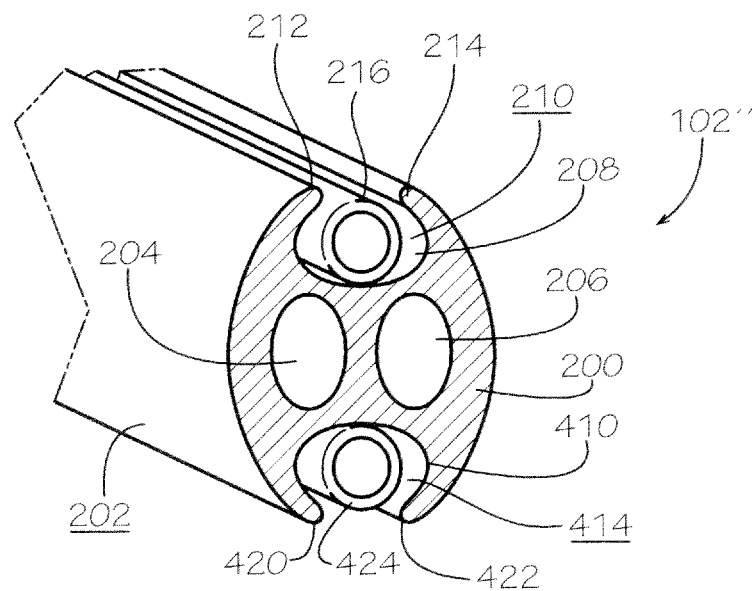
FIG. 4

US 9,655,281 B2

MODULAR COOLING SYSTEM

SUMMARY

Disclosed are technologies for modular cooling systems. According to various embodiments, a modular cooling system includes: a cold plate; a support manifold connected to the cold plate, the support manifold and cold plate together defining a fluid path for cooling fluid from the support manifold to the cold plate; and an equipment carrier including electrical equipment cooled by the cold plate.

In further embodiments, a connection manifold for a modular cooling system includes: a manifold body; a first fluid channel defined in the manifold body; and a second fluid channel defined in the manifold body, the manifold body providing mechanical support for electrical equipment cooled by the first and second fluid channels.

In further embodiments, a fluid connection system for a modular cooling system includes: a connector; a sliding arm attached to the connector; and a cam adapted to move the sliding arm, wherein the connector, the sliding arm, and the cam are configured for use in an electronic equipment rack.

Various implementations described in the present disclosure may include additional systems, methods, features, and advantages, which may not necessarily be expressly disclosed herein but will be apparent to one of ordinary skill in the art upon examination of the following detailed description and accompanying drawings. It is intended that all such systems, methods, features, and advantages be included within the present disclosure and protected by the accompanying claims.

BRIEF DESCRIPTION OF THE DRAWINGS

The features and components of the following figures are illustrated to emphasize the general principles of the present disclosure. Corresponding features and components throughout the figures may be designated by matching reference characters for the sake of consistency and clarity.

FIG. 2 is a cross-sectional view of the connector manifold of FIG. 1 taken along line 2-2.

FIG. 3 is a cross-sectional view of a connector manifold in accordance with another embodiment of the current disclosure.

FIG. 4 is a perspective view of a connector manifold in accordance with another embodiment of the current disclosure.

DETAILED DESCRIPTION

The following detailed description is directed to technologies for modular cooling systems for cooling electronic components installed in equipment racks. Electronic systems, such as computer systems, have various electronic components that use electrical energy but generate heat as a byproduct. Computer systems that are rack-based include many rack-mounted components in a high-density arrangement, which can produce a great amount of heat. If the heat is not removed from these systems, the various electronic components may suffer damage. Therefore, cooling systems are an important consideration for rack-based electronic systems. However, cooling systems typically use a large amount of materials and occupy much space within the rack-based system that could otherwise be used for increasing the drive densities of the rack-based system.

Figure 1:
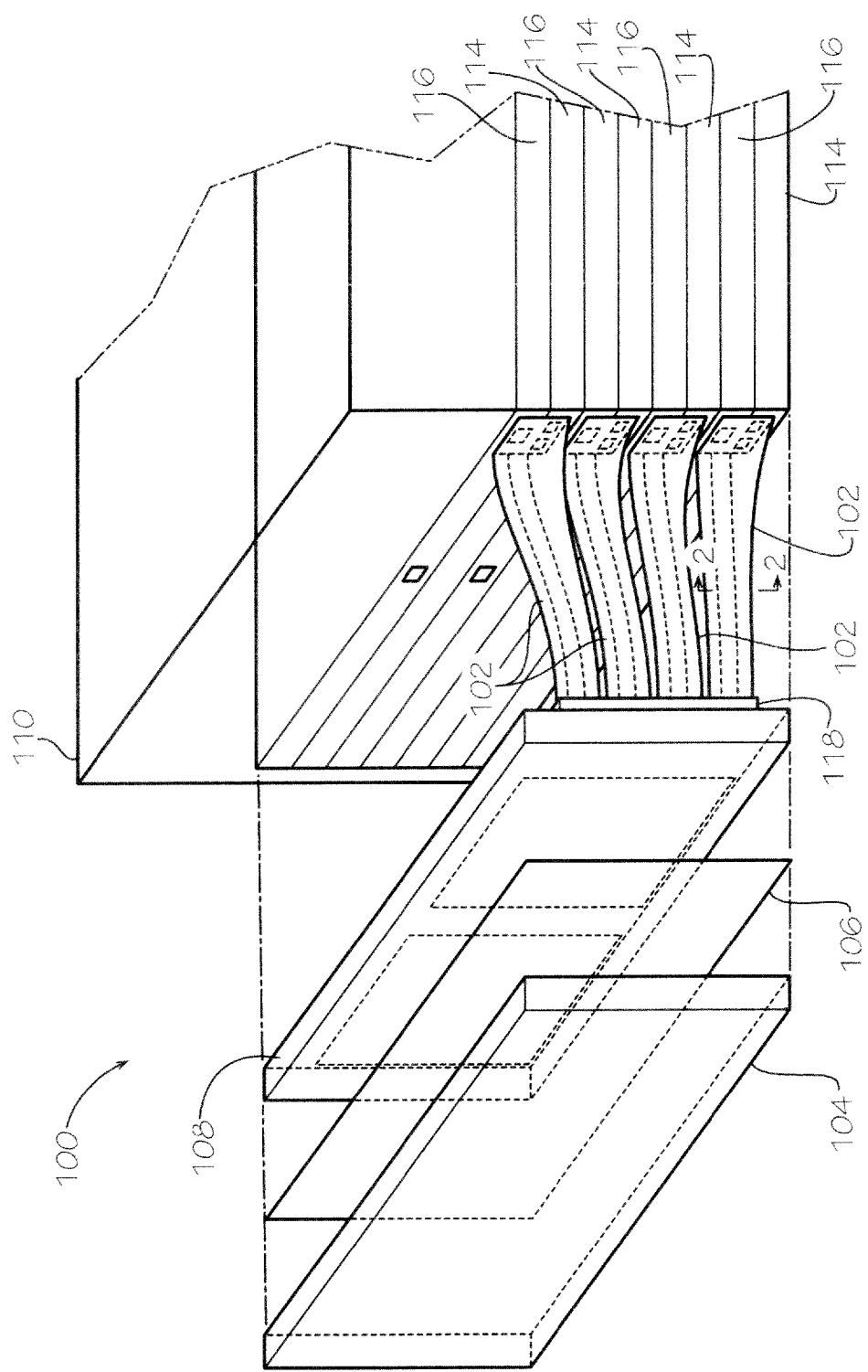
FIG. 1 is a partially-exploded perspective view of a modular cooling system with an equipment rack according to various embodiments of the present disclosure including a connector manifold connecting a tray system with a cooling manifold and heat exchanger.

Various embodiments of a modular cooling system 100 are disclosed and described in FIG. 1. The modular cooling system 100 of the various embodiments includes at least one connector manifold 102 connecting a cooling manifold 104, an airfoil 106, and a heat exchanger 108 to an equipment rack 110. The cooling manifold 104, airfoil 106, and heat exchanger 108 are utilized to supply and receive cooling fluid through the connector manifolds 102 to the equipment rack 110. In particular, the cooling manifold 104 provides coolant to a cold plate, discussed in greater detail below, to remove heat from equipment in the equipment rack 110. Passages are present in or near the cooling manifold 104 to transport the coolant returned from all sources to the heat exchanger 108 prior to cycling back to a cooling device or fan/blower module (not shown).

As shown in FIG. 1, equipment racks 110 are typically box-like structures or cabinets that contain a number of removable modules or a number of removable trays. The modules or trays may hold one or more electronic components, including, but not limited to, central processing units, storage devices, networking or communication devices and equipment, video processing equipment, and various other electronic components mounted in equipment racks. A design configuration consideration for the equipment rack 110 is to utilize most of the space within the rack 110 with placement of electronic components, such as computer servers (using a server rack), controllers, switches, and various other functional equipment, and to minimize the support or peripheral equipment, such as power distribution devices, power supply cables, and other peripheral equipment, within the rack 110.

In various embodiments, the equipment rack 110 houses at least one cooling tray 114 and at least one equipment tray 116. The trays 114,116 are stacked in the equipment rack 110. The connector manifolds 102 connect the cooling manifold 104, airfoil 106, and heat exchanger 108 to the cooling trays 114 to supply and take cooling fluid to the cooling trays 114. In various embodiments, the connector manifolds 102 also provide cabling management and connect equipment trays 116 to other power, I/O, or other equipment within the equipment rack 110 or external to the equipment rack 110. In various embodiments, the connector manifolds 102 are constructed from a material such as various metals, plastics, composites, or various other materials enabling the manifold 102 to be flexible. In various embodiments, the connector manifolds 102 are constructed from or includes a shielding material such as rubber for offering shielded management of I/O cabling or power cabling.

To access a single tray in the stack of trays 114,116, the trays 114,116 stacked on top of the target tray generally are raised or lifted to provide access to the target tray. In various embodiments where the connector manifolds 102 are flexible, even as trays 114,116 are moved vertically to access the target tray, the connector manifolds 102 maintain the integrity of the connection between the connector manifolds 102 and the trays 114,116. In this manner, the target tray may be accessed without disrupting the connections to other trays 114,116 in the equipment rack 110.

FIG. 2 is a cross-sectional view of the connector manifold 102 taken along line 2-2 in FIG. 1. As shown in FIG. 2, the connector manifold 102 includes a body 200 with an outer surface 202. The body 200 defines a first channel 204 and a second channel 206. In various embodiments, the first channel 204 is a coolant supply channel and the second channel 206 is a coolant return channel. In various other embodiments, the first channel 204 is the coolant return channel and the second channel 206 is the coolant supply channel. According to various examples, the manifold body 200 provides mechanical support for electrical equipment cooled by the first and second fluid channels.

The connector manifold 102 also includes a first groove 208 defined in the outer surface 202 and extending into the body 200. The first groove 208 defines a groove surface 210. In various embodiments, the connector manifold 102 includes a first groove extension 212 and a second groove extension 214 extending partially above the groove 208. As shown in FIG. 2, in various embodiments, the groove 208 houses a first cable 216. In this manner, the connector manifold 102 provides cable management by housing the first cable 216 in the single connector manifold 102 and thereby reducing the amount of free cables typically found in electronic or computing systems. The groove extensions 212,214 ensure that the first cable 216 is retained within the first groove 208 of the connector manifold 102. In various embodiments, the first cable 216 may be an I/O cable, data transmission cable, power cable, or any other cable used in electronics or computing systems. In various embodiments, the channels 204,206 for coolant may actively cool the first cable 216 and thereby allow for smaller conductor diameters or alternative conductor materials to be used for the manifold 102. In various embodiments, the first channel 204, the second channel 206, and the first groove 208 extend through or are defined in the body 200 for an entire length of the connector manifold 102.

FIG. 3 is a cross-sectional view of another connector manifold 102' according to further embodiments of the current disclosure. As shown in FIG. 3, the connector manifold 102' has the body 200 with the outer surface 202, the first channel 204, and the second channel 206. As shown in FIG. 3, the connector manifold 102' does not include the first groove 208 shown in FIG. 2 but otherwise functions similarly to the connector manifold 102.

FIG. 4 is a perspective view of another connector manifold 102" according to further embodiments of the current disclosure. As shown in FIG. 4, the connector manifold 102" includes the body 200 with the outer surface 202, the first channel 204, the second channel 206, and the first groove 208. The connector manifold 102" also includes a second groove 410 defined in the outer surface 202 and extending into the body 200. The second groove 410 defines a groove surface 414. In various embodiments, the connector manifold 102" may also include a third groove extension 420 and a fourth groove extension 422 extending partially above the second groove 410. As shown in FIG. 4, in various embodiments, the second groove 410 houses a second cable 424. In this manner, the connector manifold 102" provides cable management by housing the cables 216,424 in the grooves 208,410 and thereby reducing the amount of free cables typically found in electronic or computing systems. The groove extensions 420,422 ensure that the second cable 424 is retained within the connector manifold 102". The groove extensions 420,422 also ensure the cable 424 is retained within the second groove 410 of the connector manifold 102". In various embodiments, the first cable 216 is an I/O cable and the second cable 424 is a power cable. However, the disclosure of the cables 216,424 should not be considered limiting as in various embodiments, the cables 216,424 may be any type of cable used in electronics or computing systems. In various embodiments, the channels 204,206 for coolant may actively cool the cables 216,424 and thereby allow for smaller conductor diameters or alternative conductor materials to be used for the manifold 102".

Figure 5:
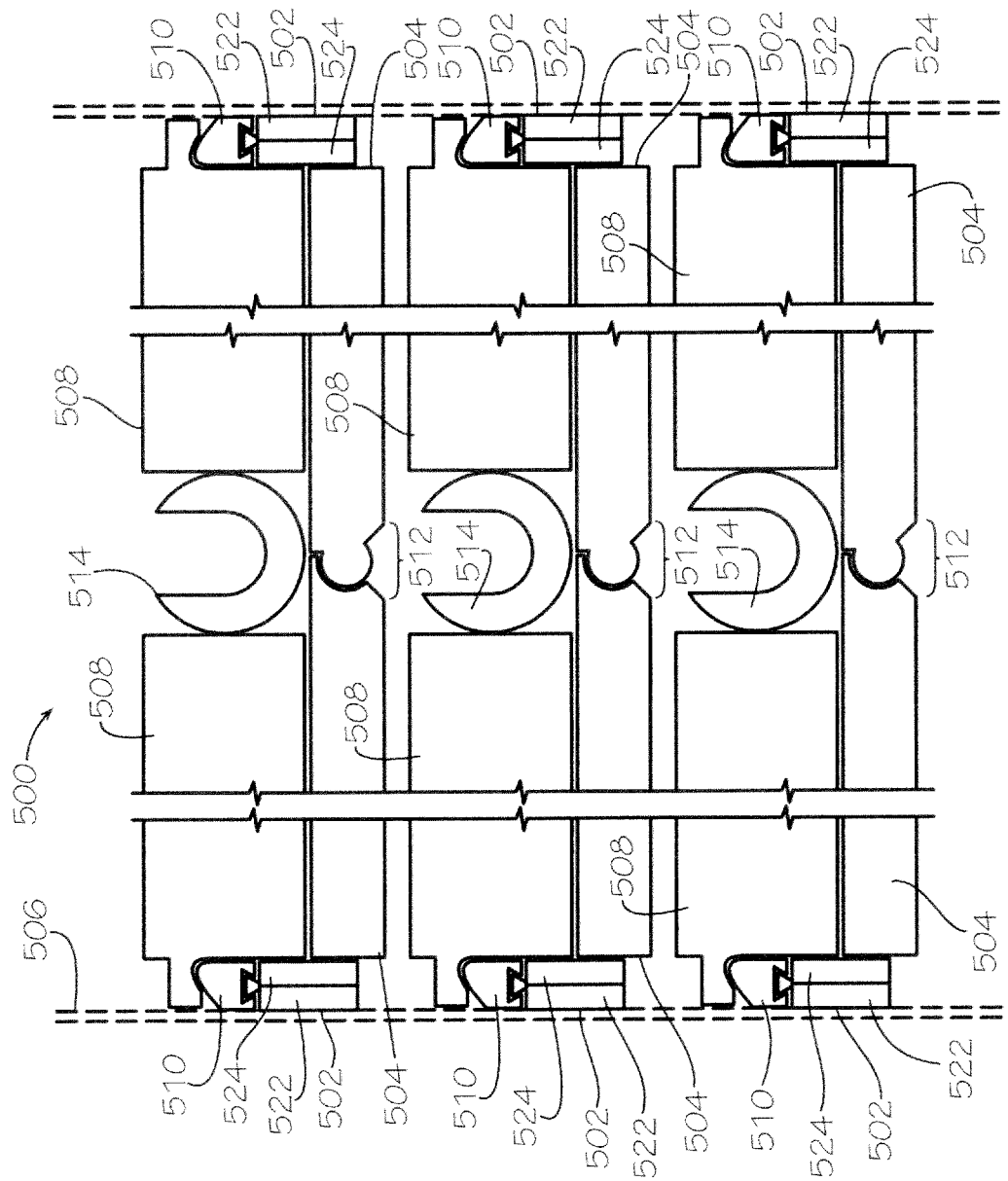
FIG. 5 is a front view of an equipment rack with a modular cooling system according to another embodiment of the present disclosure including a cold plate and support manifold.

Some components of a modular cooling system 500 are disclosed and described in FIG. 5. According to various embodiments, the modular cooling system 500 may include at least one support manifold 502 and at least one cold plate 504. In the present embodiment, the modular cooling system 500 includes a plurality of support manifolds 502 and a plurality of cold plates 504. As shown in FIG. 5, in various embodiments, the modular cooling system 500 is part of a modular carrier such as an equipment rack 506. Equipment rack 506 is similar to equipment rack 110, but equipment rack 506 contains a number of removable modules rather than removable trays as with equipment rack 110.

The equipment rack 506 includes at least one mounting mechanism for supporting an equipment carrier 508 and the support manifold 502 in the equipment rack 506. In the present embodiment, the mounting mechanism is rails 510; however, in various other embodiments, the mounting mechanism includes those mechanisms from the group including, but not limited to, slots, mounting apertures, screws, mounting brackets, runners, wheels, and any other mechanism suitable for mounting and supporting equipment modules positioned on or in the equipment rack 506.

As shown in FIG. 5, each support manifold 502 may be mounted on a rail 510. Each support manifold 502 defines a first channel 522 and a second channel 524. In various embodiments, the first channel 522 is a coolant supply channel for supplying coolant from a cooling manifold, such as cooling manifold 104, to the cold plates 504 and the second channel 524 is a coolant return channel for returning coolant from the cold plates 504 to the cooling manifold 104. In various other embodiments, the first channel 522 is the coolant return channel and the second channel 524 is the coolant supply channel. According to various examples, the support manifold 502 provides mechanical support for various electrical components to be cooled by the cold plate 504, as described in greater detail below.

As shown in FIG. 5, in various embodiments the cold plate 504 is mounted on the support manifold 502 in the equipment rack 506. In various embodiments, a single level within the equipment rack 506 includes a single cold plate 504; however, in various other embodiments, a single level within the equipment rack includes more than one cold plate 504, such as two cold plates 504. As shown in FIG. 5, the cold plates 504 on the same level include an engagement mechanism 512 for connecting the cold plates 504, as described in greater detail below with reference to FIGS. 6-8. In various embodiments, a single level within the equipment rack includes two cold plates 504, two support manifolds 502, and two rails 510.

The equipment rack 506 also includes equipment carriers 508 which support equipment for computing or electronics. As shown in FIG. 5, in various embodiments, the equipment carriers 508 are mounted on the rails 510 and in contact with the cold plates 504. As described below with reference to FIG. 9, each cold plate 504 includes coolant tubing housed within the cold plate. Coolant is supplied to the cold plate 504 through the channels 522,524 in the support manifold 502. As coolant flows through the cold plate 504, the contact between the cold plate 504 and the equipment carrier 508 allows for the transfer of heat generated by the equipment in the equipment carriers 508 to the coolant. The heated coolant flows out of the cold plate 504 and back into the support manifold 502, where the coolant is chilled again. This cycle repeats continuously to ensure the equipment of the equipment carriers 508 does not get overheated. In various embodiments, the cold plates 504 may be extendably movable along the rails 510 through the support manifolds 502 relative to the equipment rack 506. As described below in greater detail, in various embodiments the support manifolds 502 include a number of telescoping parts such that the support manifold 502 is selectively lengthened as the cold plate 504 moves relative to the rail 510. In these embodiments, the telescoping support manifolds 502 may maintain the integrity of the connection between the support manifold 502 and the cold plate 504, as will be described in greater detail below. In various embodiments, adjacent equipment carriers 508 may be coupled together with an equipment connector 514.

Figure 6:
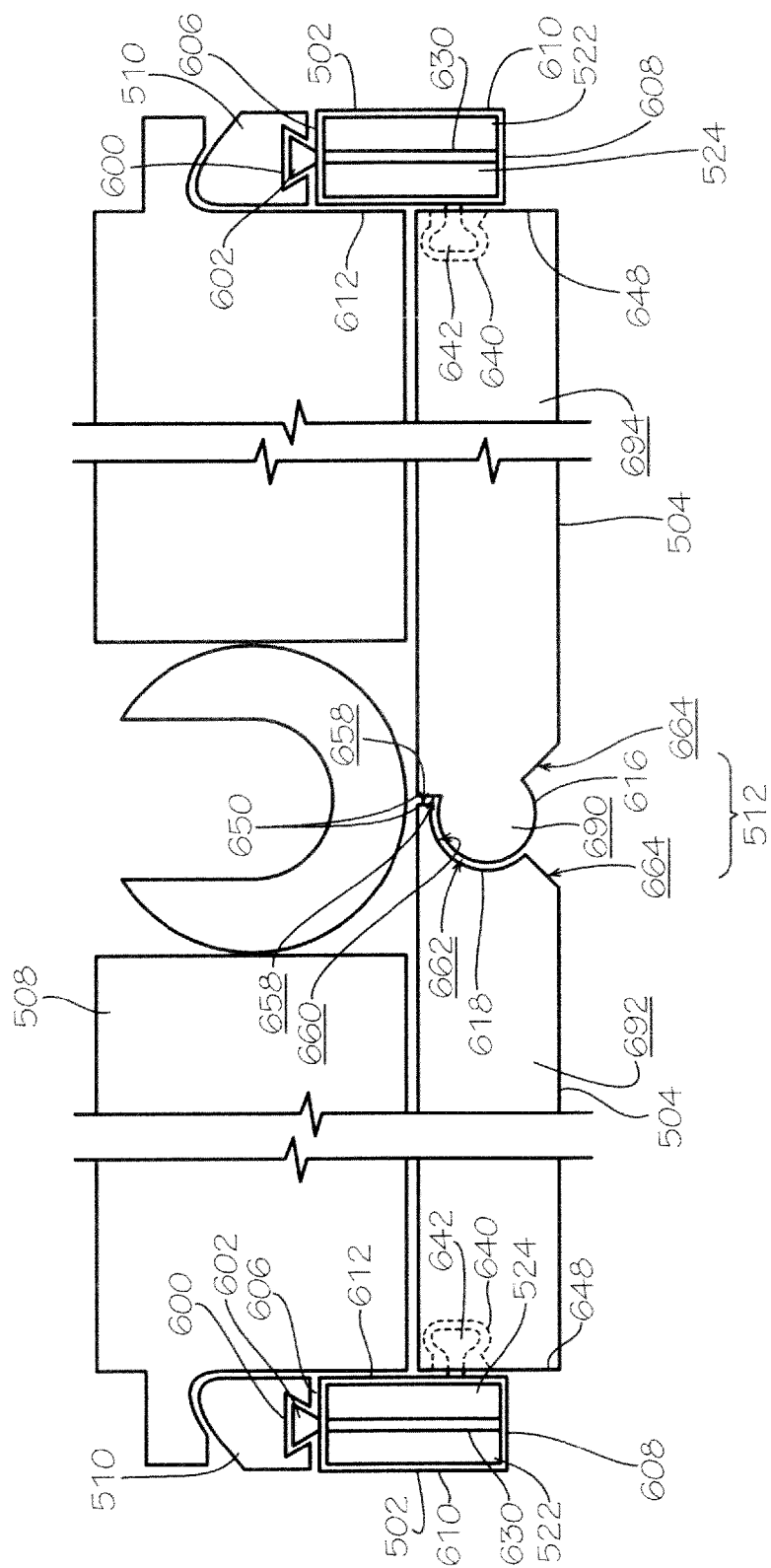
FIG. 6 is a front view of the cold plate and support manifold of FIG. 5 with the support manifold connected to a rail, the cold plate mounted on the support manifold, and a drive carrier positioned on the rail and cold plate.

FIG. 6 shows one level from the equipment rack 506 with support manifolds 502 connected to the rails 510, the cold plates 504 mounted on the support manifolds 502, and the equipment carriers 508 mounted on the rails 510 and in contact with the cold plates 504. As previously described, in various embodiments, the rail 510 is utilized in the equipment rack 506 as a mechanism for mounting and supporting various equipment within the equipment rack 506. In various embodiments, the rail 510 defines a channel 600. The channel 600 defines a profile complimentary to a key 602 of the support manifold 502 such that the key 602 may be inserted into the channel 600 to mount and secure the support manifold 502 to the rail 510. In various embodiments, the key 602 is integrally formed with the support manifold 502; however, in various other embodiments, the key 602 is attached to the support manifold 502 with an attachment mechanism such as those in the group including, but not limited to, welding, adhesives, fasteners, and various other attachment mechanisms. In various embodiments, the key 602 is movable within the channel 600 such that the support manifold 502 is movable along the rail 510 while remaining mounted on the rail 510. The shape of the rail 510, the channel 600, or the key 602 should not be considered limiting on the current disclosure as in various embodiments, the rail 510, channel 600, or key 602 may have any desired shape.

The support manifold 502 includes a top side 606, a bottom side 608, a first side 610, and a second side 612 in various embodiments. As shown in FIG. 6, the support manifold 502 also includes a center wall 630 within the support manifold 502 in various embodiments. In various embodiments, the support manifold 502 has a generally rectangular profile with the center wall 630 dividing the manifold into the first channel 522 and the second channel 524; however, the shape of the support manifold 502, the first channel 522, or the second channel 524 should not be considered limiting as in various other embodiments, the support manifold 502, first channel 522, or the second channel 524 may have a square, elliptical, circular, angled, or any other desired shape profile with a center wall 630 forming at least two channels in the manifold 502.

In various embodiments, the support manifold 502 includes a number of telescoping parts such that the support manifold 502 is selectively lengthened as the cold plate 504 moves relative to the rail 510. In various embodiments, each of the sides 606,608,610,612 include several interconnected and telescoping panels such that a length of the support manifold 502 may be selectively increased or decreased. In these embodiments, the telescoping support manifolds 502 may maintain the integrity of the connection between the support manifold 502 and the cold plate 504.

Figure 8:
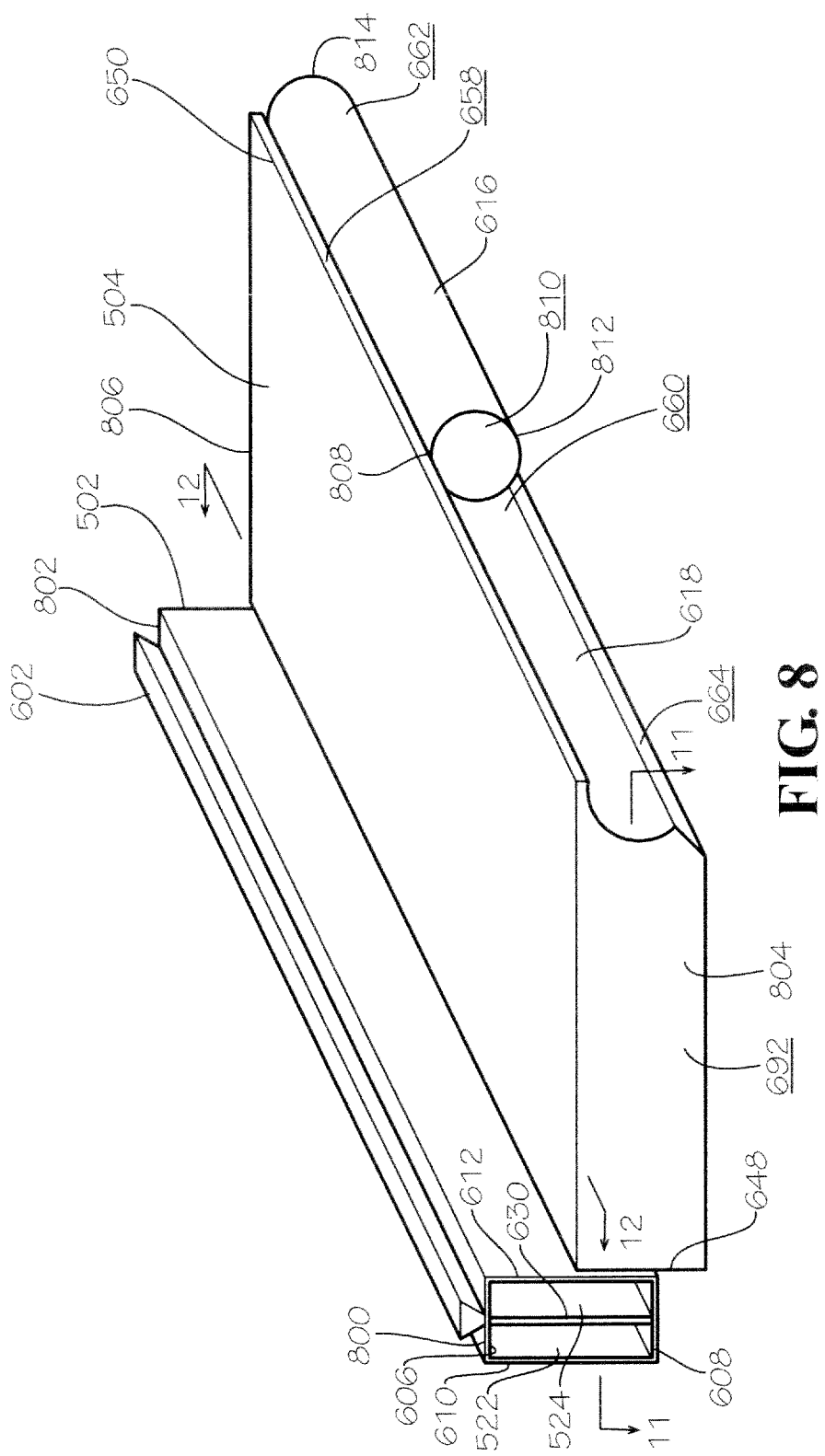
FIG. 8 is a perspective view of the cold plate and support manifold of FIG. 5.

In various embodiments, the cold plate 504 includes a manifold side 648 and a coupling side 650. In various embodiments, the coupling side 650 defines the engagement mechanism 512. In various embodiments, the engagement mechanism 512 is a rib 616 and groove 618 on each cold plate 504 engaging the corresponding rib 616 and groove 618 on an adjacent cold plate 504. FIG. 8 shows a single cold plate 504 with both the rib 616 and the groove 618. The engagement mechanism 512 allows for upward movement of the engaged or mated cold plates 504 such that the cold plates 504 may detach from each other and the support manifolds 502 while preventing downward movement of the plates 504 beyond a substantially planar configuration In various embodiments, the coupling side 650 also defines a horizontal stop surface 658 and a vertical stop surface 664. The rib 616 having a rib surface 662 is defined at the coupling side 650 for a portion of the coupling side 650 (shown in FIG. 8). As shown in FIG. 6, the rib 616 includes an outer end surface 690. In various embodiments, the outer end surface 690 of the rib 616 may be coplanar with a front end surface 692 of the cold plate 504 or a back end surface 694 of the cold plate 504; however, in various other embodiments, the outer end surface 690 is not coplanar with either the front end surface 692 or the back end surface 694. In various embodiments, the groove 618 having a groove surface 660 is defined at the coupling side 650 along a portion of the coupling side 650 (shown in FIG. 8). The profile of the rib 616 compliments the profile of the groove 618. As shown in FIG. 6, the complimentary coupling side features of one cold plate 504 and an adjacent cold plate 504 are mated, thereby providing the engagement necessary to support the cold plates 504 in the neutral position as well as the constraint necessary to permit rotation of the plates 504 only for decoupling and to avoid sagging of the plates 504. The mating of adjacent cold plates 504 will be described in greater detail below.

As shown in FIG. 6, the support manifold 502 includes a plate retainer 642 in various embodiments. The plate retainer 642 has a profile complimentary to the profile of a retainer pocket 640 formed in the cold plate 504. In various embodiments, the retainer pocket 640 is defined at the manifold side 648 of the cold plate extending from the manifold side 648 into the cold plate 504. As shown in FIG. 6, the retainer pocket 640 has a profile complimentary to the profile of the plate retainer 642 such that the plate retainer 642 is insertable into the retainer pocket 640 and engages the retainer pocket 640 to support the cold plate 504 to the support manifold 502. FIG. 6 shows the cold plate 504 in a neutral position where the plate retainer 642 is mated with the retainer pocket 640 and is providing vertical support to the cold plate 504 and horizontal retention of the cold plate 504 against the support manifold 502 without any other type of connector engagement. As shown in FIG. 6, in the neutral position, at least a portion of the manifold side 648 faces and is positioned adjacent to at least a portion of the second side 612 of the support manifold 502. The cold plate 504 via the retainer pocket 640 may be movable around the plate retainer 642 but may remain mated with the plate retainer 642 to provide support relief for the cold plate 504 as adjacent cold plates are lifted for disengagement or decoupling.

In various embodiments, individual plates 504 are manufactured by techniques such as injection molding for low cost and convenience; however, in various other embodiments, the individual cold plates 504 may be manufactured through various casting, molding, forming, machining, joining, and various other manufacturing techniques and may be constructed from various metals, composites, plastics, or various other materials. Each plate 504 is of a minimum thickness suitable to engage the plate retainer 642 on the support manifold 502. In various embodiments, each plate 504 includes alignment mechanisms, such as a protrusion defined on the top surface 520 and a recess defined on the bottom surface 654, for alignment of the plate 504 with equipment stacked immediately below the cold plate 504 in the equipment rack 506. These alignment mechanism may allow for easy stacking of equipment carriers 508 and plates 504 in the equipment rack 506, akin to a stack of books in various embodiments.

As shown in FIG. 6, the equipment carrier 508 is mounted on the rail 510 and in contact with the cold plate 504. When the equipment carrier 508 is in contact with the cold plate 504, the cold plate 504 may cool the equipment carrier 508 as coolant flows through coils housed in the cold plate 504.

Figure 7:
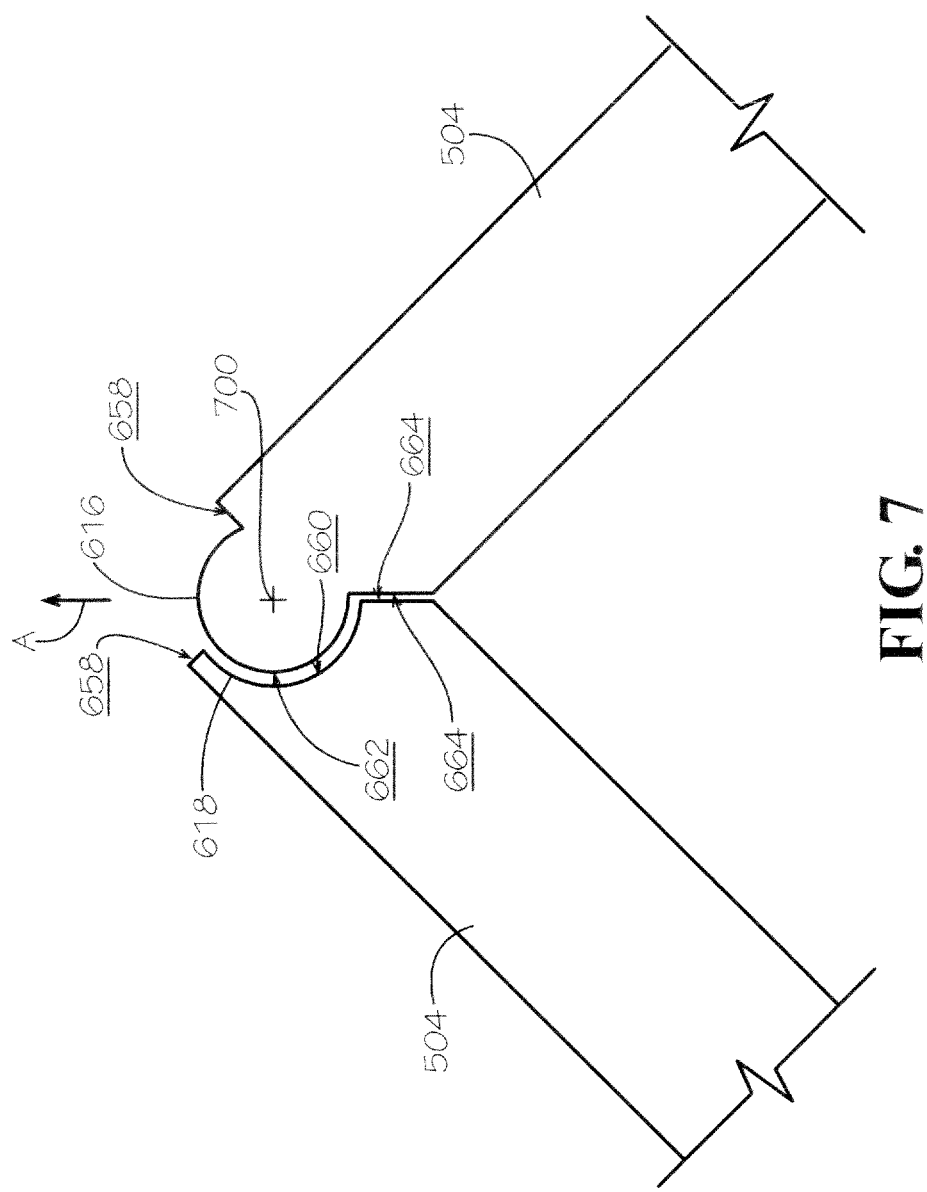
FIG. 7 is a partial front view of two cold plates of FIG. 5 in a decoupled position.

In various embodiments, two cold plates 504 are coupled together when used in the equipment rack 506. As used herein, two cold plates 504 are in a neutral or coupled position when the rib 616 of one plate 504 is mated with the groove 618 of the other cold plate 504, the horizontal stop surfaces 658 of each cold plate 504 face and abut each other, and the vertical stop surfaces 664 are spaced apart. FIG. 6 shows two cold plates 504 in the neutral position. As used herein, two cold plates 504 are in a decoupled position when the rib 616 of one plate 504 is mated with the groove 618 of the other cold plate 504, the vertical stop surfaces 664 of each cold plate 504 face and abut each other, and the horizontal stop surfaces 658 are spaced apart. FIG. 7 shows two cold plates 504 in the decoupled position. An axis of rotation 700 is defined through the center of the aligned ribs 616 of two adjoining plates 504.

In the neutral position, the plates 504 are maintained in a substantially horizontal position and the cold plates 504 are constrained from rotating below this position. Loading on the plates 504 in the neutral position is almost entirely vertical. However, the engagement of the horizontal stop surfaces 658 prevents sagging of the plates 504 where the plates 504 are coupled. Applying a downward ford on the plates 504 in the neutral position does not result in the plates decoupling or rotation below the neutral position. In the neutral position, support for each plate 504 is provided by both the plate retainer 642 engaged with the retainer pocket 640 and the cold plate 504.

As shown in FIG. 7, by applying an upward force indicated by the arrow labeled A, the plates 504 rotate about the axis of rotation 700 from the neutral position to the decoupled position. In the decoupled position, the plates 504 may be decoupled and each plate 504 may be removed independently. When one cold plate 504 is removed, the sole support for the cold plate 504 remaining within the equipment rack 506 provided by the plate retainer 642 engaged with the retainer pocket 640.

The profile of the rib 616 and rib surface 662 permits rotation of the cold plates 504 about the axis of rotation 700 between the neutral position with the horizontal stop surfaces 658 in contact with each other and the decoupled position with the vertical stop surfaces 664 in contact with each other. In various embodiments, the positioning and geometry of the horizontal stop surface 658 and vertical stop surface 664 on each plate 504 defines the degree of rotation possible for the plates 504 about the axis of rotation 700. The degree of rotation may be varied by altering the geometry of the plates 504 and the position of the horizontal stop surface 658 and vertical stop surface 664 around the axis of rotation 700.

FIG. 8 shows the cold plate 504 mounted on the support manifold 502. As shown in FIG. 8, the support manifold 502 includes a front end 800 and a back end 802. In various embodiments, either the front end 800 or the back end 802 includes a sealing mechanism, such as a plug, plate, or various other sealing mechanisms, insertable in or over the channels 522,524 at the particular end 800 or end 802. When one of the ends 800,802 is sealed, access to the respective channels 522,524 is through the unsealed end. In various other embodiments, both ends 800,802 are sealed and access to the channels 522,524 is through a connector on or through at least one of the sides 606,608,610,612 of the support manifold 502 to the channels 522,524. In various embodiments, the sides 606,608,610,612 are each constructed from interconnected panels such that the sides 606,608,610,612 are telescoping. The telescoping sides 606,608,610,612 allow a length of the support manifold 502, defined as the distance from the front end 800 to the back end 802, to be selectively adjusted to increase or decrease the length.

As shown in FIG. 8, the cold plate 504 includes a front end 804 and a back end 806. As previously described, at the coupling side 650, the cold plate 504 includes the rib 616 and the groove 618. In various embodiments, the rib 616 extends from the back end 806 to an intermediary position 808 on the coupling side 650 and the groove 618 extends from the front end 804 to the intermediary position 808 on the coupling side 650. In various other embodiments, the rib 616 extends from the front end 804 to the intermediary position 808 and the groove 618 extends from the back end 806 to the intermediary position 808. The rib 616 includes an inner end 812 having an inner end surface 810 at the intermediary position 808 and an outer end 814 having an outer end surface 690 (shown in FIG. 6) at the back end 806 of the cold plate 504. When two cold plates 504 are coupled, the inner end surfaces 810 of the cold plate 504 are positioned adjacent to and face each other. In various embodiments when two cold plates 504 are coupled, the inner end surfaces 810 abut and may come in contact with each other.

Figure 9:
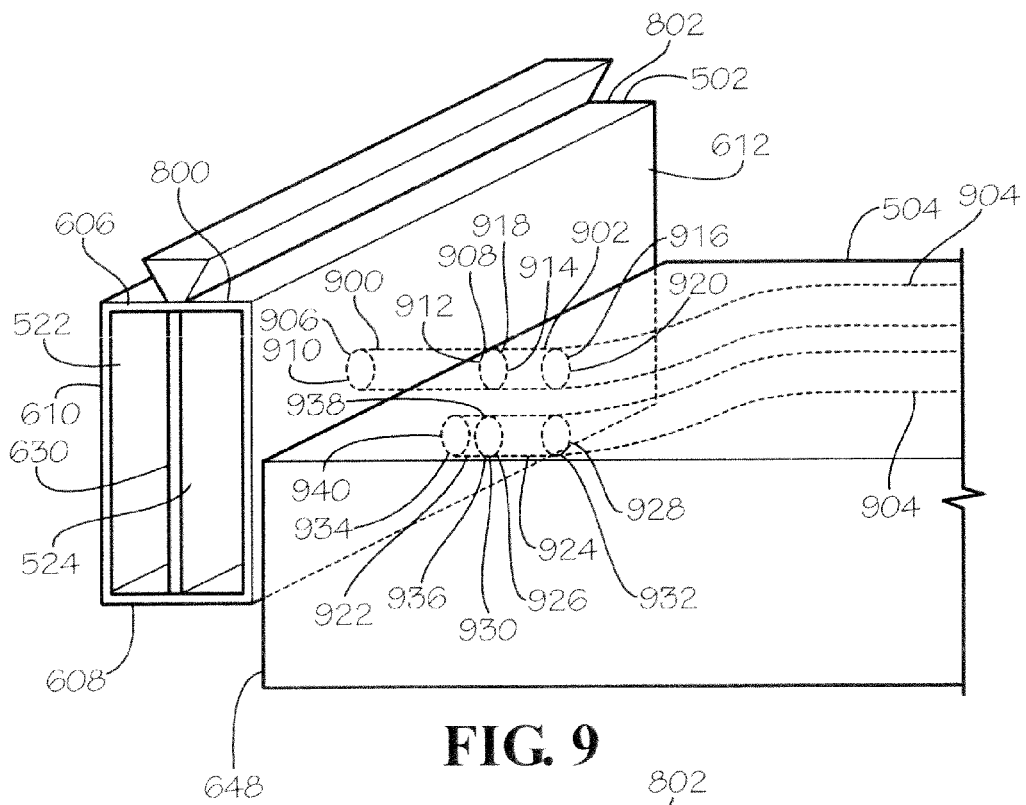
FIG. 9 is another perspective view of the cold plate and support manifold of FIG. 5 showing at least one plate connector of the cold plate in fluid communication with at least one manifold connector of the support manifold.

As shown in FIG. 9, in various embodiments, a manifold supply connector 900 in the support manifold 502 is connectable with a plate supply connector 902 in the cold plate 504 to define a flow path from the first channel 522, through the connectors 900,902, to coolant tubing 904 part of a cooling system within the cold plate 504. In various embodiments, the manifold supply connector 900 is connectable with the plate supply connector 902 when the cold plate 504 is in the neutral position and the connectors 900,902 are engaged. As shown in FIG. 9, in various embodiments, the manifold supply connector 900 includes a first end 906 and a second end 908 and defines a fluid passageway from the first end 906 to the second end 908. In various embodiments, the manifold supply connector 900 extends from at least the first channel 522, through the center wall 630, through the second channel 524, and to the second side 612 of the support manifold 502. In various embodiments, the first end 906 defines and inlet 910 in fluid communication with the first channel 522 to allow coolant to flow into the manifold supply connector 900. The second end 908 defines an outlet 912. In various embodiments, the outlet 912 includes a plug that selectively opens the outlet 912 when the manifold supply connector 900 and plate supply connector 902 are connected and allows fluid flow out of the outlet 912.

As further shown in FIG. 9, the plate supply connector 902 includes a first end 914 and a second end 916. The plate supply connector 902 defines a fluid passageway from the first end 914 to the second end 916. The plate supply connector 902 extends from at least the manifold side 648 of the cold plate 504 to the coolant tubing 904 in the cold plate 504. The first end 914 defines and inlet 918. In various embodiments, the inlet 918 includes a plug that selectively opens the inlet 918 when the manifold supply connector 900 and plate supply connector 902 are connected and enables fluid flow from the outlet 912 of the manifold supply connector 900 into the inlet 918 of the plate supply connector 902. The second end 916 defines an outlet 920 in fluid communication with the inlet portion 904a to allow coolant to flow from the plate supply connector 902 to the coolant tubing 904.

In various embodiments, a manifold return connector 922 in the support manifold 502 is connectable with a plate return connector 924 in the cold plate 504 to define a flow path from the coolant tubing 904, through the connectors 900,902, to the second channel 524 in the support manifold 502. In various embodiments, the plate return connector 924 includes a first end 926 and a second end 928. The plate return connector 924 defines a fluid passageway from the first end 926 to the second end 928. The plate return connector 924 extends from at least the manifold side 648 of the cold plate 504 to the coolant tubing 904 in the cold plate 504. The first end 926 defines and outlet 930. In various embodiments, the outlet 930 includes a plug that selectively opens the outlet 930 when the manifold return connector 922 and plate return connector 924 are connected and enables fluid flow from the outlet 930 of the plate return connector 924. The second end 916 defines an inlet 932 in fluid communication with the outlet portion 904b to allow coolant to flow from the coolant tubing 904 to the and plate return connector 924.

The manifold return connector 922 is connectable with the plate return connector 924 when the cold plate 504 is in the neutral position and the connectors 922,924 are engaged. As shown in FIG. 9, the manifold return connector 922 includes a first end 934 and a second end 936. The manifold return connector 922 defines a fluid passageway from the first end 934 to the second end 936. The manifold return connector 922 extends from at least the second channel 524 to the second side 612 of the support manifold 502. In various embodiments, the second end 936 defines and inlet 938. In various embodiments, the inlet 938 includes a plug that selectively opens the inlet 938 when the manifold return connector 922 and plate return connector 924 are connected and allows fluid flow from coolant tubing 904, out the outlet 930 of the plate return connector 924, into the inlet 938 of the manifold return connector 922, and into the second channel 524. The first end 934 defines an outlet 940. In various embodiments, the outlet 940 is in fluid communication with the second channel 524.

Although two pairs of connectors are shown in the present embodiment, the supply connectors 900,902 and the return connectors 922,924, the number of connectors should not be considered limiting as in various other embodiments, any desired number of connectors may be utilized. In addition, the shape of the connectors 900,902,922,924 should not be considered limiting on the current disclosure as in various embodiments, the connectors 900,902,922,924 may have any desired shape defining a fluid passageway through the connectors 900,902,922,924 and enabling fluid flow from the support manifold 502 to the cold plate 504. The connectors 900,902,922,924 will be described in greater detail below with reference to FIGS. 23-25.

Figure 10:
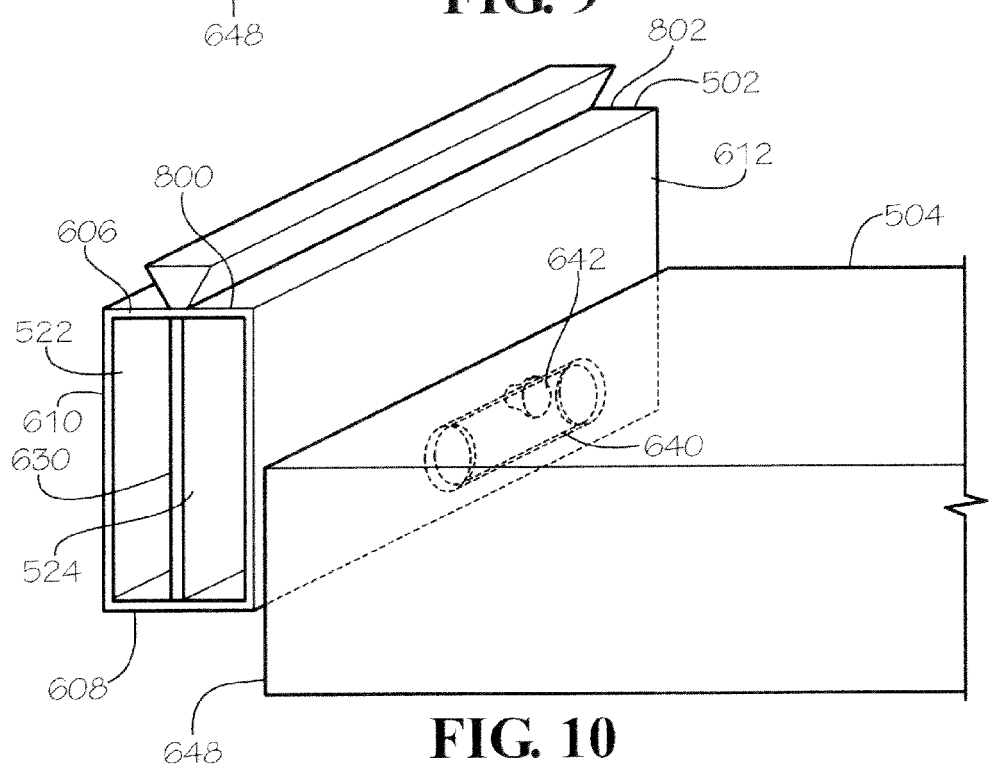
FIG. 10 is another perspective view of the cold plate and support manifold of FIG. 5 showing the cold plate mounted on the support manifold.

FIG. 10 shows the plate retainer 642 of the support manifold 502 positioned in the retainer pocket 640 of the cold plate 504 in the neutral position. As previously described, the profile of the plate retainer 642 is complimentary to the profile of the retainer pocket 640. In the neutral position, the profile of the plate retainer 642 mates with the retainer pocket 640 to provide both vertical support to the cold plate 504 and horizontal retention of the cold plate 504 against the support manifold 502. In various embodiments, the plate retainer 642 and retainer pocket 640 provide horizontal retention of the cold plate 504 without any connector engagement such as supply connectors 900, 902 and/or return connectors 922,924. In various embodiments, the cold plate 504 may be variably positioned relative to the support manifold 502 by variably positioning the plate retainer 642 within the retainer pocket 640.

Figure 11:
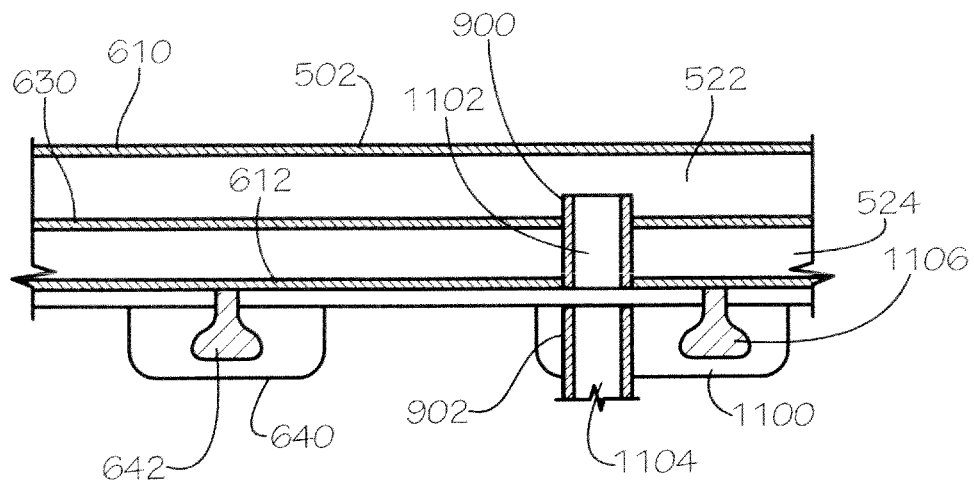
FIG. 11 is a partial top view of the support manifold and cold plate of FIG. 5 taken along line 11-11 in FIG. 8.

FIG. 11 shows a partial cross-sectional view of the cold plate 504 mounted on the support manifold 502 taken along line 11-11 in FIG. 8. As shown in FIG. 11, the plate retainer 642 is positioned in the retainer pocket 640 in the neutral position. FIG. 11 also shows a manifold supply fluid passageway 1102 of the manifold supply connector 900 and a plate supply fluid passageway 1104 of the plate supply connector 902. As shown in FIG. 11, in various embodiments, the cold plate 504 also defines a coolant connector pocket 1100. In various embodiments, a coolant pocket retainer 1106 is positioned in the coolant connector pocket 1100 for mounting and retaining the cold plate 504 on the support manifold 502 through an actuation system, which is described in greater detail with reference to FIGS. 18-21. In various embodiments, the coolant pocket retainer 1106 is substantially similar to the plate retainer 642. In various other embodiments, the coolant connector pocket 1100 includes a profile complimentary to the coolant pocket retainer 1106 such that coolant pocket retainer 1106 engages the coolant connector pocket 1100 to retain the cold plate 504 against the support manifold 502. As shown in FIG. 11, the coolant connector pocket 1100 includes at least a portion of the plate supply connector 902 extending through the coolant connector pocket 1100.

Figure 12:
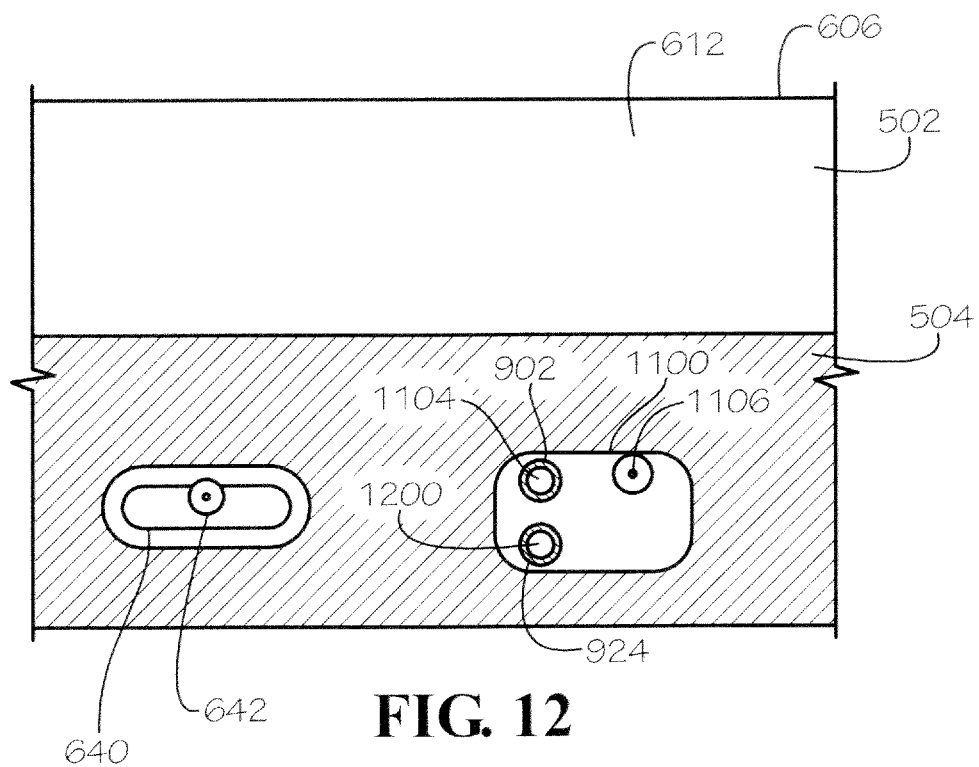
FIG. 12 is a partial side view of the support manifold and cold plate of FIG. 1 taken along line 12-12 in FIG. 8.

FIG. 12 shows a partial cross-sectional view of the cold plate 504 mounted on the support manifold 502 taken along line 12-12 in FIG. 8. As shown in FIG. 12, the plate retainer 642 is positioned in the retainer pocket 640 in the neutral position. In addition, the connectors 902,924 are positioned in the coolant connector pocket 1100 to connect with connectors 900,922 of the support manifold 502. As shown in FIG. 12, a portion of the plate return connector 924 extends through the coolant connector pocket 1100. FIG. 12 also shows the plate return fluid passageway 1200 of the plate return connector 924.

Figure 13:
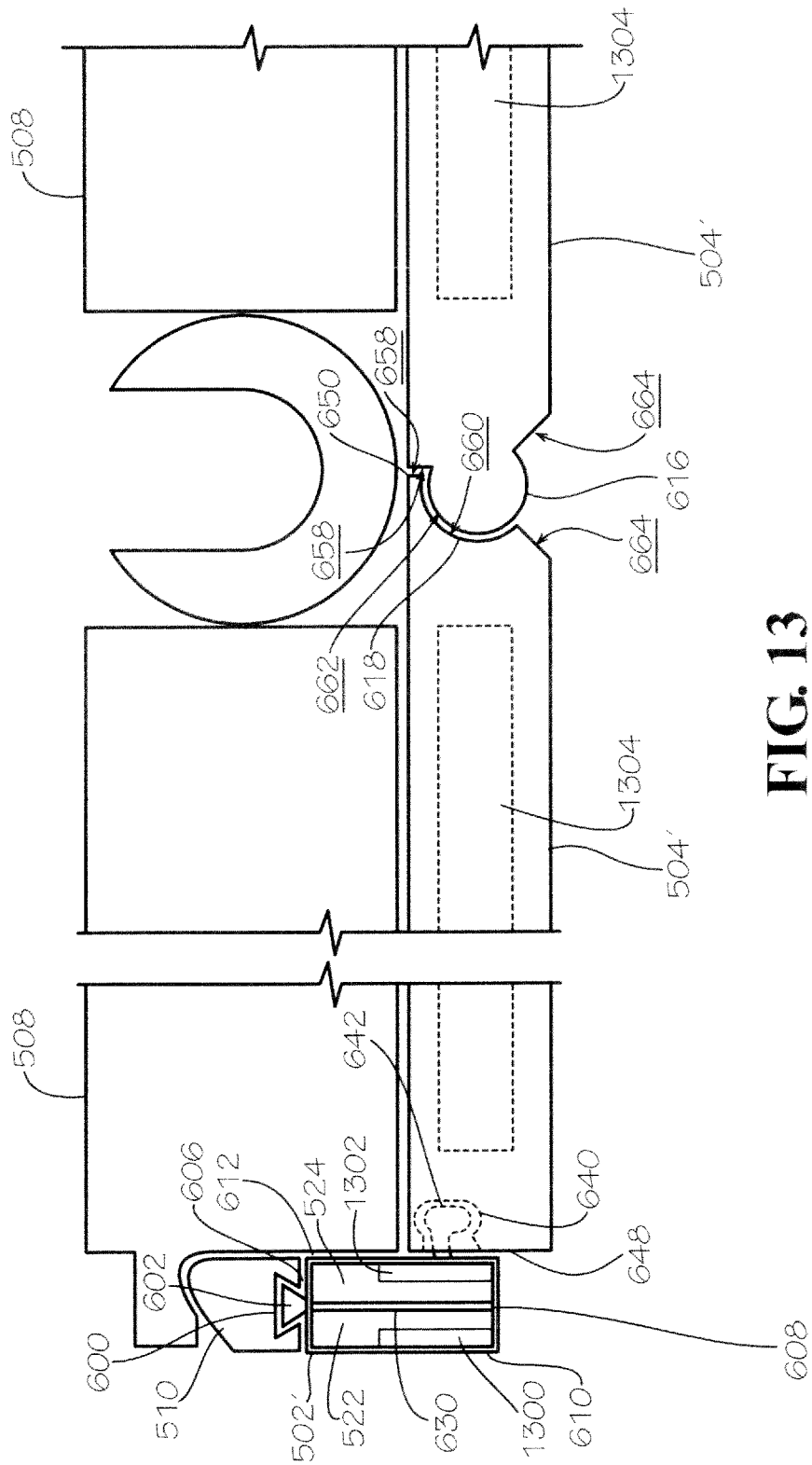
FIG. 13 is a partial front view of a manifold cooling system in accordance with another embodiment of the current disclosure including a cold plate and a support manifold with the support manifold connected to a rail, the cold plate mounted on the support manifold, and a drive carrier positioned on the rail and cold plate.

FIG. 13 shows a front view of other embodiments of a support manifold 502' and cold plate 504'. As shown in FIG. 13, in various embodiments, the support manifold 502' is substantially similar to the support manifold 502 and includes all the aforementioned components of the support manifold 502. In addition, the support manifold 502' includes voltage and ground electrical connectors. In the present embodiment, the electrical connectors are a first bus bar 1300 and a second bus bar 1302; however, the disclosure of the bus bars 1300,1302 should not be considered limiting on the current disclosure. In various embodiments, the bus bars 1300,1302 are insulated. The first bus bar 1300 has a first polarity and the second bus bar 1302 has a second polarity opposite of the first polarity. As shown in FIG. 13, in various embodiments the first bus bar 1300 is entirely housed within the first channel 522 and positioned at least proximate to the first side 610 and the second bus bar 1302 is entirely housed within the second channel 524 and positioned at least proximate to the second side 612. In various embodiments, the bus bars 1300, 1302 may be positioned against the respective sides 610,612 without causing a short circuit due to the bus bars 1300, 1302 being insulated. As will be described below with reference to FIG. 15, in various embodiments, electrical connectors connect the bus bars 1300,1302 to a power module 1304 in the cold plate 504'. Because the bus bars 1300,1302 are positioned within the channels 522,524, the bus bars 1300,1302 are cooled in various embodiments. In these embodiments, the cooling of the bus bars 1300,1302 permits higher power densities in the bus bars 1300,1302, which may be utilized by the various components in the equipment rack 506.

Figure 14:
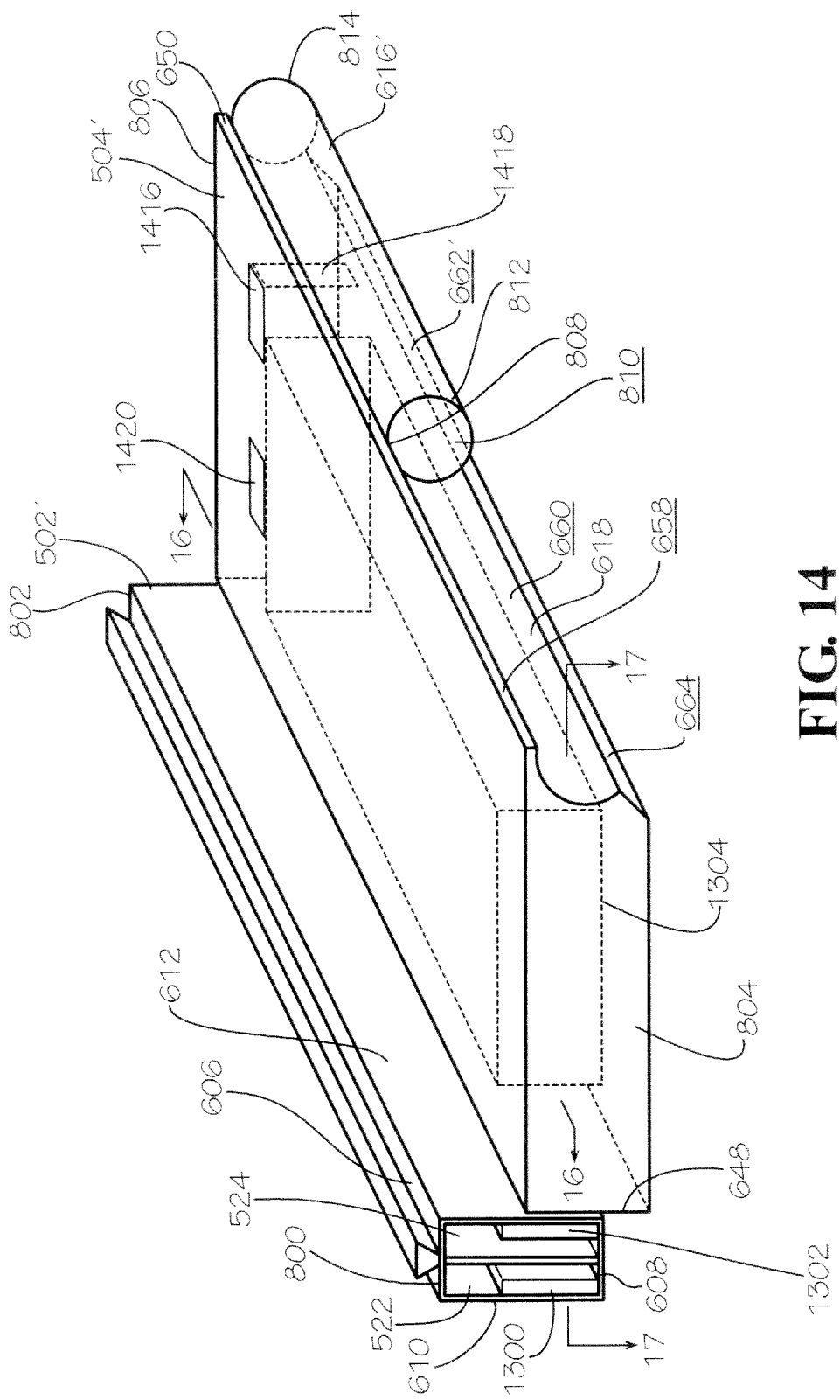
FIG. 14 is a perspective view of a support manifold and cold plate of FIG. 13.

In various embodiments, the cold plate 504' is substantially similar to the cold plate 504 and includes all the aforementioned components of the cold plate 504. In addition, the cold plate 504' includes the power module 1304. As shown in FIG. 14, in various embodiments, the power module 1304 is housed within the cold plate 504'. The shape of the power module 1304 should not be considered limiting on the current disclosure. In the present embodiment, the power module 1304 is a battery; however, in various other embodiments, the power module 1304 may be any source of power for various components mounted in the equipment rack 506 or any other power-related equipment. For example, in various embodiments, the power module 1304 may include additional equipment for local AC-DC power conversion, DC-DC power conversion, and/or battery backup solutions.

As further shown in FIG. 14, the cold plate 504' includes a power connector 1420 enabling connectivity with various electronic components in the equipment rack 506. The cold plate 504' may also include a control connector 1416 proximate to the back end 806 enabling connectivity with external controls. As shown in FIG. 14, in various embodiments, the cold plate 504' further includes a control board 1418 housed within the cold plate 504'. The control board 1418 may be a printed circuit board ("PCB"), flex circuit board, or any other desired type of control board. The control board 1418 is connected to the power module 1304 and the bus bars 1300,1302 and may be used to regulate the power module 1304. In various embodiments, the control board 1418 may be housed within the power module 1304

Figure 15:
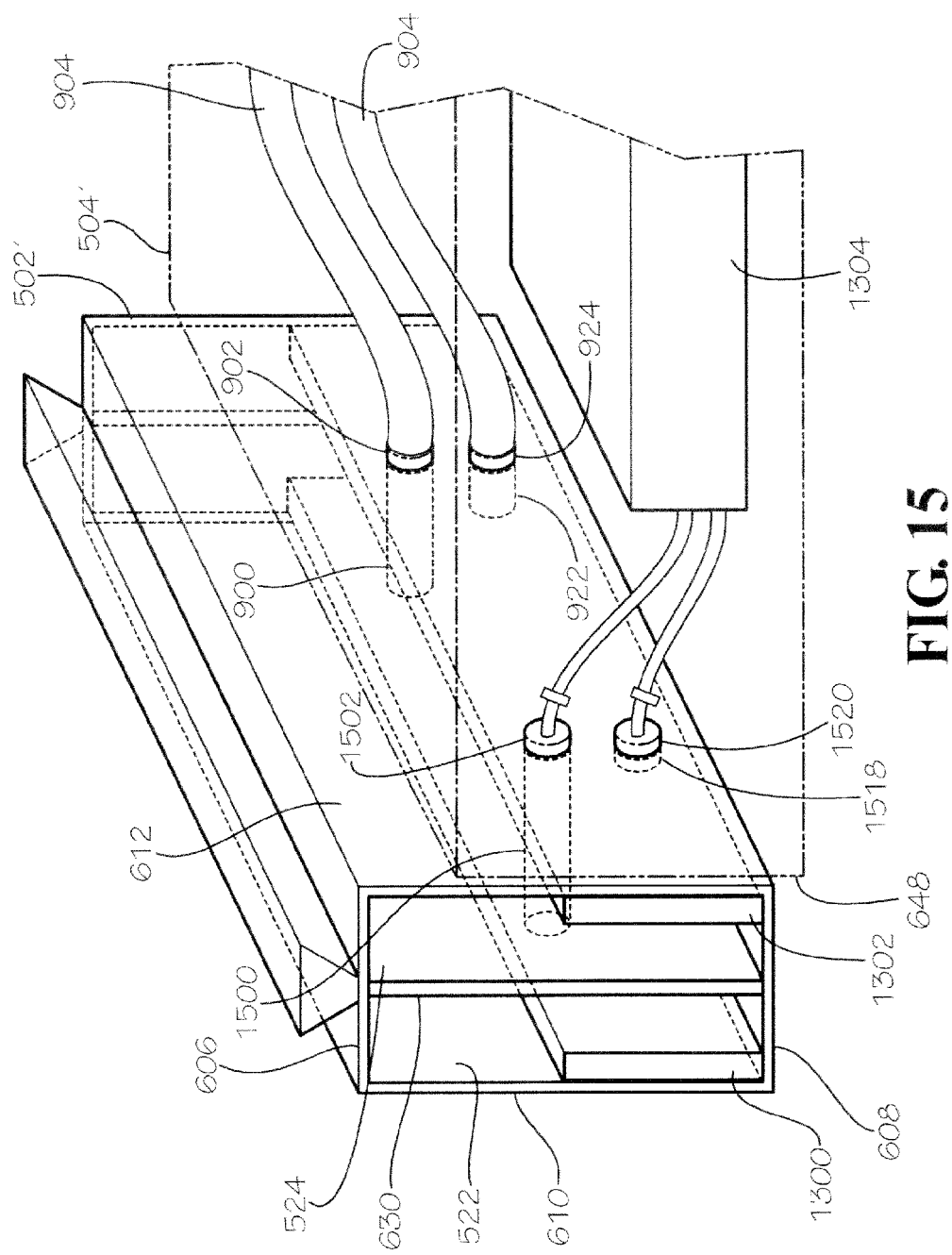
FIG. 15 is another perspective view of the support manifold and cold plate of FIG. 13.

FIG. 15 shows various connectors for connecting the cold plate 504' with the support manifold 502'. In various embodiments, the manifold supply connector 900 extends from at least the first channel 522, through the center wall 630, through the second channel 524, through the second bus bar 1302, and to the second side 612 of the support manifold 502'. In various other embodiments, the manifold supply connector 900 is positioned such that it does not extend through the second bus bar 1302. As shown in FIG. 15, in various embodiments, the plate supply connector 902 extends from at least the manifold side 648 of the cold plate 504' to the coolant tubing 904 in the cold plate 504'. In various embodiments, the plate return connector 924 extends from at least the manifold side 648 of the cold plate 504' to the coolant tubing 904 in the cold plate 504'. In various embodiments, the manifold return connector 922 extends from at least the second channel 524, through the second bus bar 1302, and to the second side 612 of the support manifold 502'. In various other embodiments, the manifold return connector 922 is positioned such that it does not extend through the second bus bar 1302

In various embodiments, in addition to the connectors 900,902,922,924, a manifold voltage connector 1500 in the support manifold 502' is connectable with a plate voltage connector 1502 in the cold plate 504'. In various embodiments, the connectors 1500,1502 define an electrical connection path from the first bus bar 1300, through the connectors 1500, 1502, to the power module 1304 in the cold plate 504'. In various embodiments, the manifold voltage connector 1500 is connectable with the plate voltage connector 1502 when the cold plate 504' is in the neutral position and the connectors 1500,1502 are engaged. The manifold voltage connector 1500 electrically connects to the first bus bar 1300 and extends through the first channel 522, the center wall 630, the second channel 524, and the second bus bar 1302 to the second side 612 of the support manifold 502' in various embodiments. In various other embodiments, the manifold voltage connector 1500 is positioned such that it does not extend through the second bus bar 1302.

In various embodiments, the plate voltage connector 1502 electrically engages the manifold voltage connector 1500 and is further electrically connected to the power module 1304 in the cold plate 504'. In various embodiments when the manifold voltage connector 1500 and the plate voltage connector 1502 are connected, an electrical circuit is completed enabling electrical flow from the first bus bar 1300, through the connectors 1500,1502, to the power module 1304.

In various embodiments, a manifold ground connector 1518 in the support manifold 502' is electrically connectable with a plate ground connector 1520 in the cold plate 504' to define a flow path from the power module 1304, through the connectors 1518,1520, to the second bus bar 1302 in the support manifold 502. In various embodiments, the manifold ground connector 1518 is connectable with the plate ground connector 1520 when the cold plate 504' is in the neutral position and the connectors 1518,1520 are engaged. As shown in FIG. 15, the manifold ground connector 1518 electrically connects to the second bus bar 1302 and extends to the second side 612 of the support manifold 502'.

In various embodiments, the plate ground connector 1520 electrically engages the manifold ground connector 1518 and is further is electrically connected to the power module 1304 in the cold plate 504'. In various embodiments when the manifold ground connector 1518 and the plate ground connector 1520 are connected, an electrical circuit is completed enabling electrical flow from the power module 1304, through the connectors 1518,1520, to the second bus bar 1302. The number or shape of the connectors 1500,1502, 1518,1520 should not be considered limiting on the current disclosure as in various other embodiments, any number of connectors may be used and the connectors 1500,1502,1518, 1520 may have any desired shape or configuration for establishing an electrical pathway from the bus bars 1300, 1302, through the connectors 1500,1502,1518,1520, and to the power module 1304.

Figure 16:
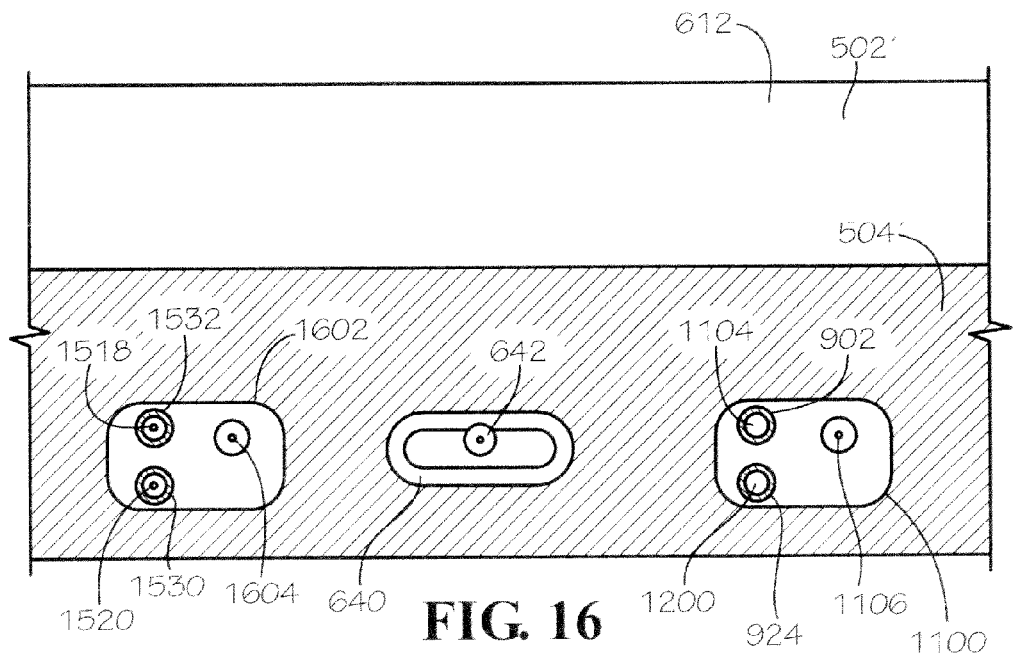
FIG. 16 is a partial side view of the support manifold and cold plate of FIG. 13 taken along line 16-16 in FIG. 14.

FIG. 16 shows a partial cross-sectional view of the cold plate 504 mounted on the support manifold 502' taken along line 16-16 in FIG. 14. As shown in FIG. 16, the plate retainer 642 is positioned in the retainer pocket 640 and the coolant pocket retainer 1106 is positioned in the coolant connector pocket 1100 in the neutral position. In various embodiments, the cold plate 504' also defines a power connector pocket 1602. The power connector pocket 1602 may include a power pocket retainer 1604 positioned in the power connector pocket 1602 for mounting and retaining the cold plate 504' on the support manifold 502'. In various embodiments, the power pocket retainer 1604 is substantially similar to the coolant pocket retainer 1106 and the plate retainer 642. The power connector pocket 1602 may also include at least a portion of the plate voltage connector 1502 extending through the power connector pocket 1602 and a portion of the plate ground connector 1520 extending through the power connector pocket 1602.

Figure 17:
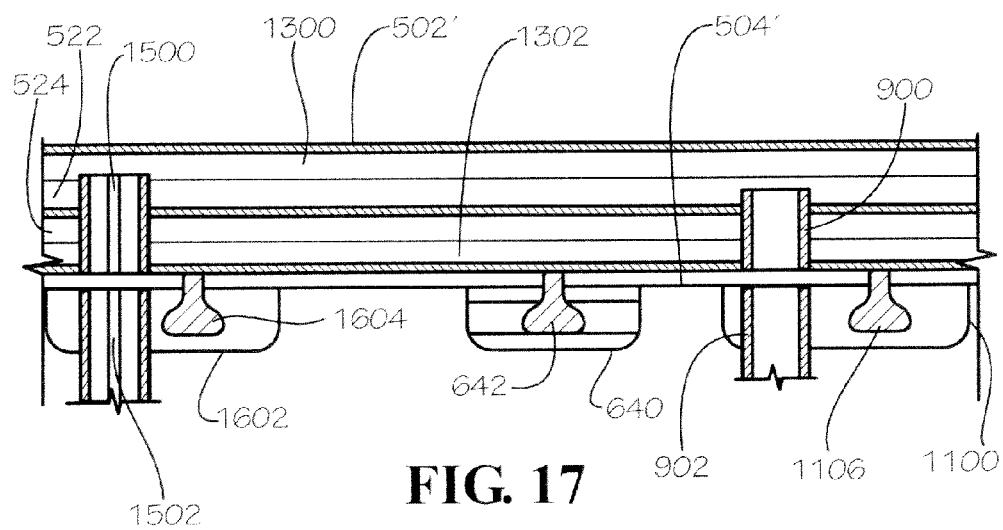
FIG. 17 is a partial top view of the support manifold and cold plate of FIG. 13 the cold plate and support manifold taken along line 17-17 in FIG. 14.

FIG. 17 shows a partial cross-sectional view of the cold plate 504' mounted on the support manifold 502' taken along line 17-17 in FIG. 14. As shown in FIG. 17, in various embodiments, a plate retainer 642 is positioned in the retainer pocket 640, the coolant pocket retainer 1106 is positioned in the coolant connector pocket 1100, and the power pocket retainer 1604 is positioned in the power connector pocket 1602 in the neutral position. In addition, the connectors 902,924 are positioned in the coolant connector pocket 1100 to connect with connectors 902,922 of the support manifold 502'. The power connector pocket 1602 includes the connectors 1502,1520 positioned in the power connector pocket 1602 to connect with the connectors 1500,1518 of the support manifold 502'.

Figure 18:
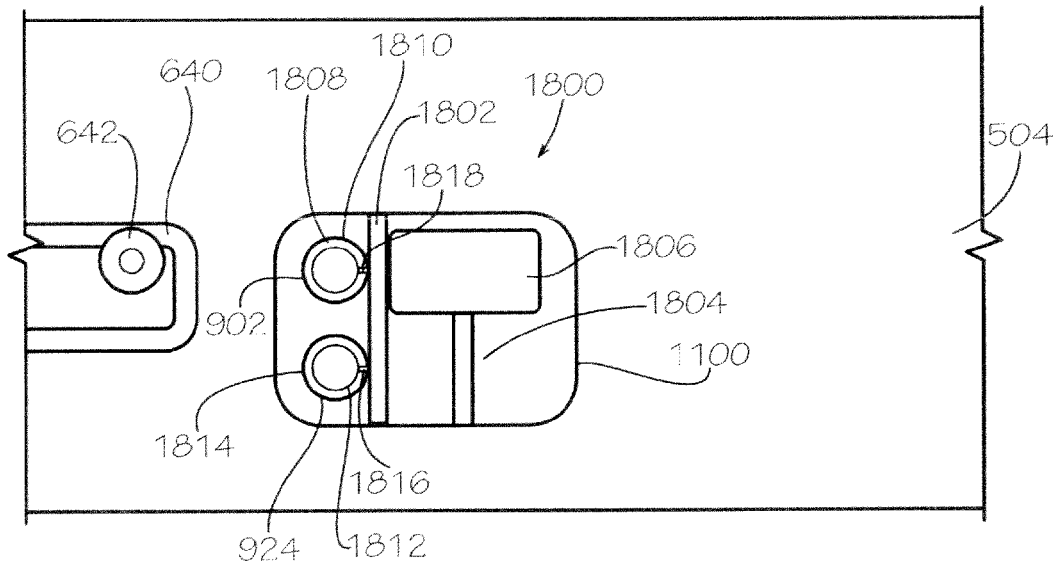
FIG. 18 is a partial side view of the cold plate and support manifold of FIG. 5 showing an actuation system including a pivot pin, cam, and sliding pin.

FIG. 18 shows various embodiments of an actuation system 1800 for use with connectors 902,924. In various embodiments, the actuation system 1800 may be utilized with the cold plate 504 and support manifold 502 or the cold plate 504' and support manifold 502'. As shown in FIG. 18, in various embodiments, plate supply connector 902 includes an inner sleeve 1808 and an outer sleeve 1810 and the plate return connector 924 includes an inner sleeve 1812 and an outer sleeve 1814. In various embodiments, any of the connectors 900,902,922,924 may include an inner sleeve similar to inner sleeves 1808,1812 and an outer sleeve similar to outer sleeves 1810,1814. In the current embodiment, the sleeves 1808,1810,1812,1814 have a tubular shape; however, the shape of the sleeves 1808,1810,1812, 1814 should not be considered limiting on the current disclosure as in various other embodiments, the sleeves 1808,1810,1812,1814 may have any desired shape. As will be described below, the inner sleeves 1808,1812 are movably positioned within the outer sleeves 1810,1814 to selectively engage any of the connectors in the cold plates 504 with connectors in the support manifold 502. The number of sleeves in each connector should not be considered limiting on the current disclosure.

As shown in FIG. 18, in various embodiments, the actuation system 1800 includes a sliding pin 1802, a pivot pin 1804, and a cam 1806 mounted on the pivot pin 1804. As shown in FIG. 18, the sliding pin 1802 includes a first pin arm 1816 connected to the inner sleeve 1808 through a first sliding slot 1918 in the outer sleeve 1810. In various embodiments, the sliding pin 1802 also includes a second pin arm 1818 connected to the inner sleeve 1812 through a second sliding slot (not shown) in the outer sleeve 1814. As described below, the sliding pin 1802 is slidably positioned by the cam 1806 from a position spaced away from the manifold side 648 within the cold plate 504 to a position proximate or adjacent to the manifold side 648.

Figure 19:
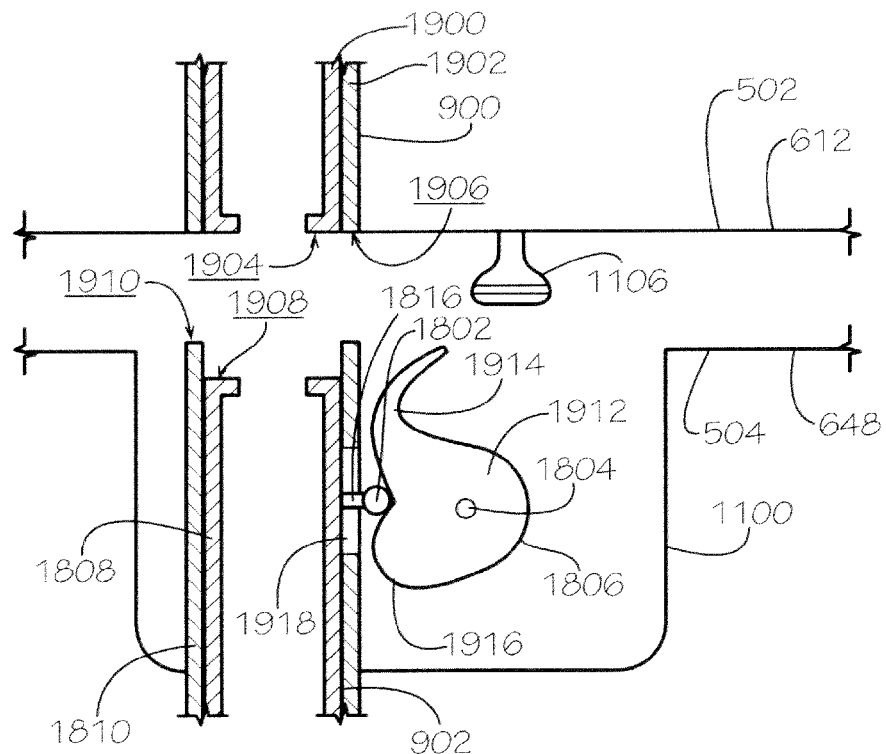
FIG. 19 is a partial cross-sectional view of the pivot pin, cam, and sliding pin of the actuation system of FIG. 18 in an unmated and disengaged position.

FIG. 19, shows the cold plate 504 and support manifold 502 in a disengaged and unmated position. As shown in FIG. 19, in this position, the plate retainer 642 is not positioned within the coolant connector pocket 1100 and the manifold side 648 of the cold plate 504 is spaced apart from the second side 612 of the support manifold 502. As shown in FIG. 19, in various embodiments, the manifold supply connector 900 includes an inner sleeve 1900 and an outer sleeve 1902. The inner sleeve 1900 includes an inner sleeve outer surface 1904 and the outer sleeve includes an outer sleeve outer surface 1906. Although not shown, in various embodiments, the manifold return connector 922 also includes an inner sleeve and an outer sleeve; however, the number of sleeves of the manifold supply connector 900 or the manifold return connector 922 should not be considered limiting on the current disclosure.

As shown in FIG. 19, the inner sleeve 1808 of the plate supply connector 902 includes an outer surface 1908 and the outer sleeve 1810 of the plate supply connector 902 includes an outer surface 1910. In the disengaged and unmated position, the inner sleeve 1808 is recessed into the cold plate 504 such that the outer surface 1908 is spaced away from the manifold side 648 into the cold plate 504 and inward into the cold plate 504 relative to outer surface 1910.

The cam 1806 includes a body 1912 having a claw portion 1914 and a hump portion 1916. The claw portion 1914 is used to engage the plate retainer 642 and the hump portion 1916 is used to movably position the sliding pin 1802 from a position spaced away from the manifold side 648 to a position proximate to the manifold side 648. As shown in FIG. 19, in the disengaged and unmated position, the claw portion 1914 is disengaged from the plate retainer 642 and the hump portion 1916 is disengaged from the sliding pin 1802.

Figure 20:
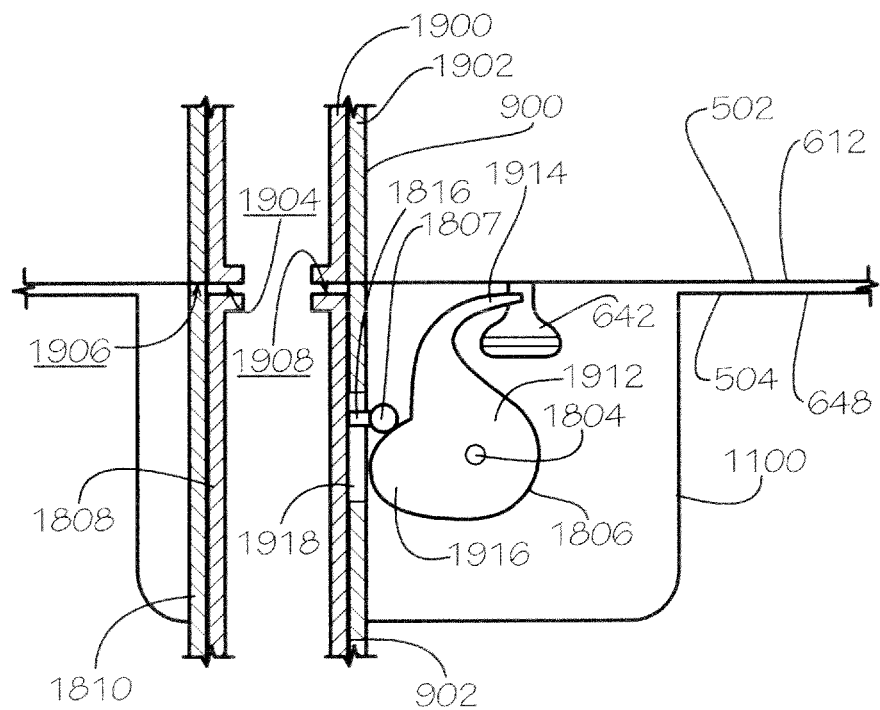
FIG. 20 is a partial cross-sectional view of the pivot pin, cam, and sliding pin of the actuation system of FIG. 18 in an unmated and engaged position.

FIG. 20 shows the cold plate 504 and support manifold 502 in a mated but disengaged position. In this position, the cold plate 504 and support manifold 502 are positioned at least adjacent to each other such that the second side 612 is positioned adjacent to the manifold side 648. As shown in FIG. 20, in this position, the outer surface 1906 of the outer sleeve 1902 of the manifold supply connector 900 is at least adjacent to the outer surface 1910 of the outer sleeve 1810 of the plate supply connector 902. In the mated but disengaged position, the outer surface 1908 of the inner sleeve 1808 of the plate supply connector 902 is positioned spaced apart from the outer surface 1904 of the inner sleeve 1900 of the manifold supply connector 900.

As shown in FIG. 20, in the mated but disengaged position, the cam 1806 is partially rotated about the pivot pin 1804 such that the claw portion 1914 partially engages the plate retainer 642 to hold the cold plate 504 against the support manifold 502. The rotation of the cam 1806 about the pivot pin 1804 also causes the hump portion 1916 to contact the sliding pin 1802. In various embodiments, the hump portion 1916 contacts the sliding pin 1802 without moving the sliding pin 1802 in the mated but disengaged position.

Figure 21:
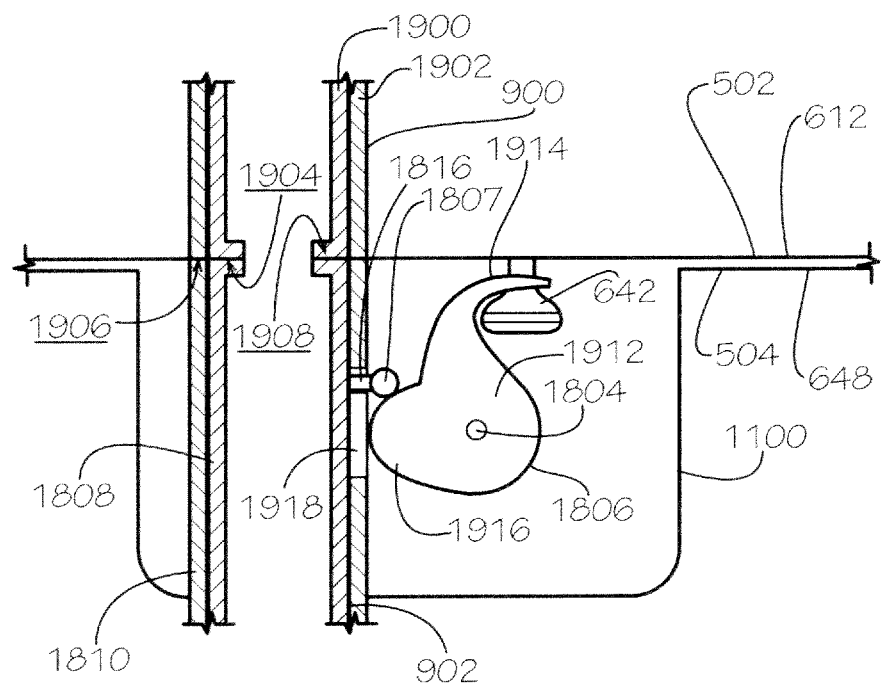
FIG. 21 is a partial cross-sectional view of the pivot pin, cam, and sliding pin of the actuation system of FIG. 18 in a mated and engaged position.

FIG. 21 partially shows the cold plate 504 and support manifold 502 in a mated and engaged position. As shown in FIG. 21, in this position, similar to the mated but disengaged position, the second side 612 is positioned adjacent to the manifold side 648 and the outer surface 1906 of the outer sleeve 1902 of the manifold supply connector 900 is positioned at least adjacent to the outer surface 1910 of the outer sleeve 1810 of the plate supply connector 902. In addition, in this position, the outer surface 1908 of the inner sleeve 1808 of the plate supply connector 902 is positioned at least adjacent to the outer surface 1904 of the inner sleeve 1900 of the manifold supply connector 900.

As shown in FIG. 21, in the mated and engaged position, the cam 1806 is further rotated about the pivot pin 1804 such that the claw portion 1914 full engages the plate retainer 642 and holds the cold plate 504 against the support manifold 502 more securely relative to the mated but disengaged position. In addition, in the mated and engaged position, the additional rotation of the cam 1806 about the pivot pin 1804 causes the hump portion 1916 to engage the sliding pin 1802 and push the sliding pin 1802 towards the manifold side 648 of the cold plate 504. As the sliding pin 1802 is pushed and movably positioned towards the manifold side 648 through the hump portion 1916, the first pin arm 1816 is movably positioned by sliding in the first sliding slot 1918. As the first pin arm 1816 is slid through the first sliding slot 1918, the first pin arm 1816 moves the inner sleeve 1808 towards the manifold side 648 such that the outer surface 1908 is positioned proximate to the manifold side 648 and may be positioned adjacent to the outer surface 1904 of the inner sleeve 1900 of the manifold supply connector 900.

Figure 22:
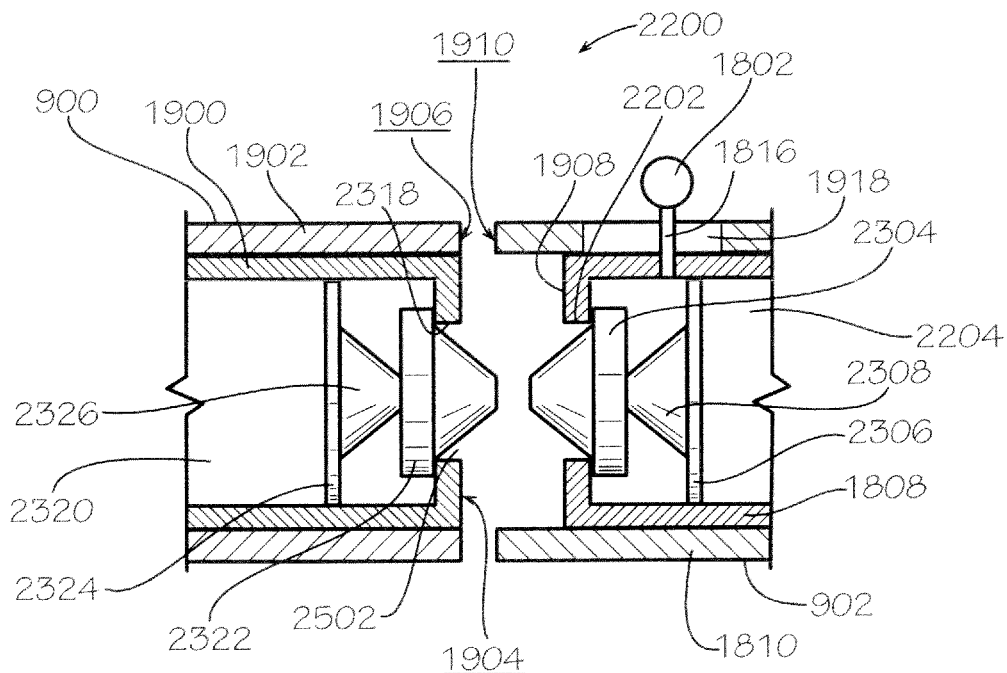
FIG. 22 is a detailed view of the at least one plate connector and the at least one manifold connector of FIG. 9 in an unmated and disengaged position.
Figure 23:
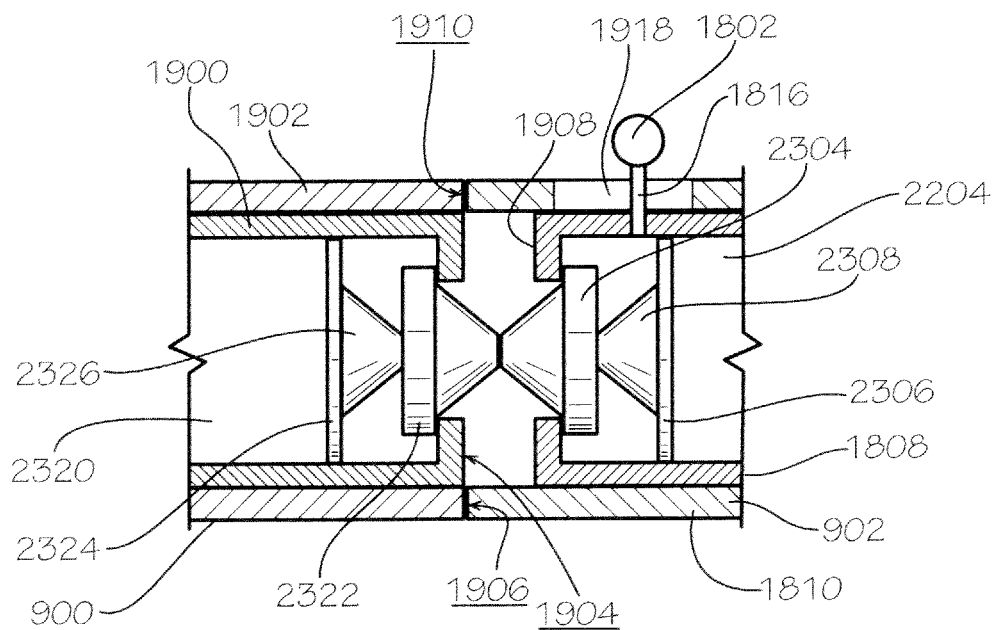
FIG. 23 is a detailed view of the at least one plate connector and the at least one manifold connector of FIG. 9 in an unmated and engaged position.
Figure 24:
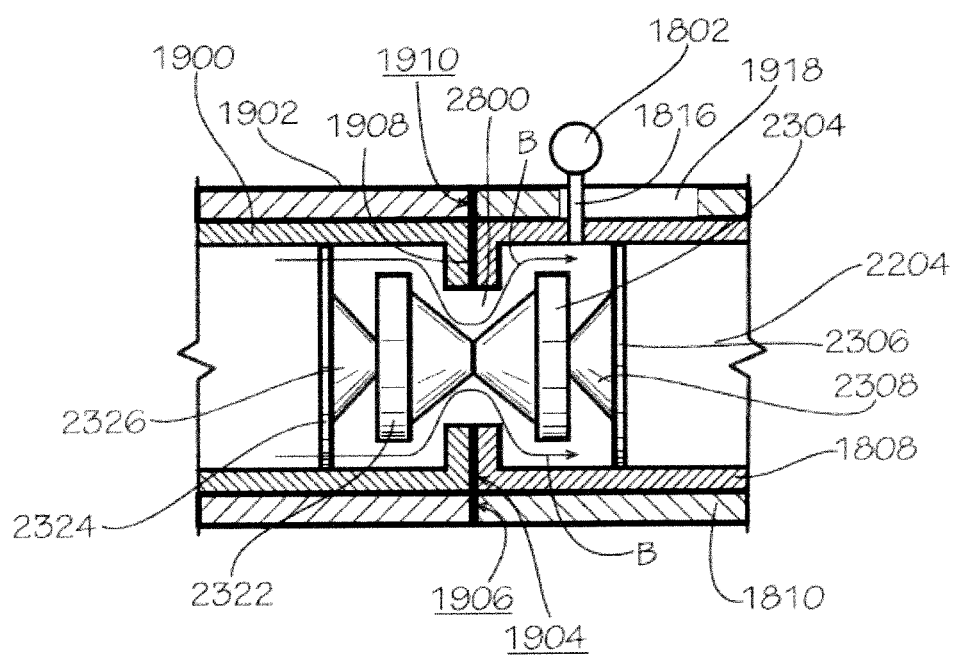
FIG. 24 is a detailed view of the at least one plate connector and the at least one manifold connector of FIG. 9 in a mated and engaged position.

FIGS. 22-24 show cross-sectional views of an engagement mechanism 2200 which may be used in combination with the actuation system 1800 described in FIGS. 19-21. As shown in FIG. 22, the engagement mechanism includes a sealer 2304, a support 2306, and a coned-disc spring 2308 in the plate supply connector 902 and a sealer 2322, a support 2324, and a coned-disc spring 2326 in the manifold supply connector 900. The disclosure of the coned-disc springs 2308,2326 should not be considered limiting on the current disclosure as in various other embodiments, various other similar spring mechanisms may be utilized. For exemplary purposes, FIGS. 22-24 show the engagement mechanism 2200 with the manifold supply connector 900 and the plate supply connector 902; however, the following discussion is equally applicable to any of the connectors 900, 922 or connectors 902, 924.

As shown in FIG. 22 and described previously with reference to FIG. 19, the manifold supply connector 900 includes the inner sleeve 1900 having the outer surface 1904 and the inner sleeve 1900 having the outer surface 1906 in various embodiments. The plate supply connector 902 includes the inner sleeve 1808 having the outer surface 1908 and the outer sleeve 1810 having the outer surface 1910. The sliding pin 1802 is connected to the inner sleeve 1808 of the plate supply connector 902 through the first pin arm 1816.

As shown in FIG. 22, the outer surface 1908 of the inner sleeve 1808 defines an inlet 2202 which provides access to a central passageway 2204. In various embodiments, the central passageway 2204 of the inner sleeve 1808 allows for fluid flow from the inlet 2202 into the cold plate 504. As shown in FIG. 22, in various embodiments, the sealer 2304, the support 2306, and the spring 2308 are positioned within the central passageway 2204 of the inner sleeve 1808. The sealer 2304 is of sufficient diameter such that the sealer 2304 completely blocks the inlet 2202 in the disengaged and unmated position and prevents fluid flow through the inlet 2202. The support 2306 is fixably positioned relative to the inner sleeve 1808. The spring 2308 is positioned between the sealer 2304 and the support 1206. In various embodiments, the spring 2308 biases the sealer 2304 towards the outer surface 1908 of the inner sleeve 1808 such that the sealer 2304 blocks the inlet 2202 in the disengaged and unmated position. In various embodiments, the sealer 2304, support 2306, and spring 2308 may be constructed from an electrically conductive material for power transmission applications. In various other embodiments, the sealer 2304, support 2306, and spring 2308 may be constructed from an electrically insulated material for fluid coupling applications. As a group, the sealer 2304, support 2306, and spring 2308 maintain the integrity of the fluid pathway or electrical circuit through the inner sleeve 1808.

The manifold supply connector 900 includes the inner sleeve 1900 having the outer surface 1904 and the outer sleeve 1902 having the outer surface 1906. In various embodiments, the inner sleeve 1900 defines an outlet 2318 in the outer surface 1904. The outlet 2318 provides access to a central passageway 2320. In various embodiments, the central passageway 2320 enables fluid flow from one of the channels 522,524 to the outlet 2318. As shown in FIG. 22, in various embodiments, the sealer 2322, the support 2324, and the spring 2326 are positioned within the central passageway 2320 of the inner sleeve 1900. The sealer 2322 is of sufficient diameter such that the sealer 2322 completely blocks the outlet 2318 in the disengaged and unmated position and prevents fluid flow through the outlet 2318. The support 2324 is fixably positioned relative to the inner sleeve 2310. As shown in FIG. 22, the spring 2326 is positioned between the sealer 2322 and the support 2324. In various embodiments, the spring 2326 acts against the sealer 2322 such that the sealer 2322 blocks the outlet 2318 in the disengaged and unmated position. In various embodiments, the sealer 2322, support 2324, and spring 2326 may be constructed from an electrically conductive material for power transmission applications. In various other embodiments, the sealer 2322, support 2324, and spring 2326 may be constructed from an electrically insulated material for fluid coupling applications. As a group, the sealer 2322, support 2324, and spring 2326 maintain the integrity of the fluid pathway or electrical circuit through the inner sleeve 2310.

FIG. 23 shows the manifold supply connector 900 and the plate supply connector 902 in the mated but disengaged position. As shown in FIG. 23, in this position, the outer surface 1910 of the outer sleeve 1810 engages the outer surface 1906 of the outer sleeve 1902 to provide mechanical engagement between the connectors 900,902. In addition, in this position, the sealer 2304 engages the sealer 2322 to provide further mechanical engagement between the connectors 900,902. However, as previously shown in FIG. 20, in the mated but disengaged position, the cam 1806 has not engaged the sliding pin 1802 to move the sliding pin 1802 laterally towards the manifold side 648. As such, the sliding pin 1802 has not caused the first pin arm 1816 to move the inner sleeve 1808 laterally outwards towards the manifold side 648. As shown in FIG. 23, the force of the spring 2326 on the sealer 2322 continues to cause the sealer 2322 to block the outlet 2318 and the force of the spring 2308 on the sealer 2304 continues to cause the sealer 2304 to block the inlet 2202.

FIG. 24 shows the manifold supply connector 900 and the plate supply connector 902 in the mated and engaged position. In this position, the inner sleeve 1808 is moved laterally outwards towards the manifold side 648 when the sliding pin 1802 has moved via the cam 1806. As shown in FIG. 25, in various embodiments, in this position, the outer surface 1908 of the inner sleeve 1808 engages the outer surface 1904 of the inner sleeve 1900. As shown in FIG. 24, the sealer 2304 engages the sealer 2322. However, unlike the mated but disengaged position, in the mated and engaged position, the force supplied by moving and positioning the inner sleeve 1808 laterally outwards via the sliding pin 1802 is sufficient to overcome the force supplied by the springs 2326,2308 biasing the sealers 2322,2304 closed. As such, a passageway 2800 is created between the plate supply connector 902 and the manifold supply connector 900. The passageway 2800 enables fluid flow, indicated by arrows labeled B in FIG. 24, between the connectors 900,902. This connection enables fluid flow from the support manifold 502, through the manifold supply connector 900, through the plate supply connector 902, and into the cold plate 504.

One should note that conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more particular embodiments or that one or more particular embodiments necessarily include logic for deciding, with or without user input or prompting, whether these features, elements and/or steps are included or are to be performed in any particular embodiment.

It should be emphasized that the above-described embodiments are merely possible examples of implementations, merely set forth for a clear understanding of the principles of the present disclosure. Many variations and modifications may be made to the above-described embodiment(s) without departing substantially from the spirit and principles of the present disclosure. Further, the scope of the present disclosure is intended to cover any and all combinations and sub-combinations of all elements, features, and aspects discussed above. All such modifications and variations are intended to be included herein within the scope of the present disclosure, and all possible claims to individual aspects or combinations of elements or steps are intended to be supported by the present disclosure.

That which is claimed is:

1. A cooling system comprising:
    a first cold plate, the first cold plate comprising:
        a first connector rib,
        a first connector groove,
        a first vertical stop surface, and
        a first horizontal stop surface;
    a second cold plate, the second cold plate comprising:
        a second connector rib engaging the first connector groove,
        a second connector groove engaging the first connector rib,
        a second vertical stop surface, and
        a second horizontal stop surface;
    a support manifold connected to the first cold plate, the support manifold and the first cold plate together defining a fluid path for cooling fluid from the support manifold to the first cold plate; and
    an equipment carrier including electrical equipment cooled by at least one of the first cold plate or the second cold plate; the first horizontal stop surface engaging the second horizontal stop surface and the first vertical stop surface disengaging from the second vertical stop surface in a neutral position, and the first vertical stop surface engaging the second vertical stop surface and the first horizontal stop surface disengaging from the second horizontal stop surface in a disengaged position.

2. The cooling system of claim 1, further comprising a modular carrier, wherein the first cold plate, second cold plate, equipment carrier, and support manifold are mounted within the modular carrier.

3. The cooling system of claim 1, wherein
    at least one of the first cold plate and the second cold plate defines a retainer pocket; and
    the support manifold comprises a plate retainer, wherein the plate retainer is removably connected to the retainer pocket.

4. The cooling system of claim 3, wherein the support manifold further comprises a first channel and a second channel, wherein the first channel is a coolant supply channel and the second channel is a coolant return channel, and wherein the support manifold provides mechanical support for the electrical equipment.

5. The cooling system of claim 1, further comprising a first bus bar in a first channel of the support manifold, a second bus bar in a second channel of the support manifold, and a power module housed in one of the first cold plate and the second cold plate, wherein the power module is in electrical communication with the first bus bar and the second bus bar.

6. The cooling system of claim 1, wherein at least a one of the first cold plate and the second cold plate includes a plate connector and the support manifold includes a manifold connector engageable with the plate connector, and wherein the electrical equipment is selected from the group consisting of storage devices, central processing units, networking devices, communication devices, and video processors.

7. A fluid connection system comprising:
   a connector;
   a sliding arm attached to the connector; and
   a cam adapted to move the sliding arm; the sliding arm, connector, and cam configured for use in an electronic equipment rack.

8. The fluid connection system of claim 7, wherein the cam defines a claw portion and a hump portion, wherein the hump portion is engageable with a sliding pin connected to the sliding arm.

9. The fluid connection system of claim 8, wherein the sliding pin is movable by the hump portion, wherein the fluid connection system defines:
   a disengaged and unmated position when the hump portion and sliding pin are disengaged,
   a disengaged and mated position when the hump portion and sliding pin are in contact and the sliding pin is unmoved, and
   an engaged and mated position when the hump portion and sliding pin are in contact and the sliding pin is moved by the hump portion.

10. The fluid connection system of claim 7, further comprising a pivot pin.

11. The fluid connection system of claim 7, wherein the connector comprises an inner sleeve and an outer sleeve, the connector further comprising a sliding slot defined in the outer sleeve, wherein the sliding arm is movable in the sliding slot.

\* \* \* \* \*